US012760143B2

(12) United States Patent
Sukegawa et al.

(10) Patent No.: US 12,760,143 B2
(45) Date of Patent: Oct. 13, 2026

(54) RESIN COMPOSITION FOR MOLDING AND ELECTRONIC COMPONENT DEVICE

(71) Applicant: RESONAC CORPORATION, Tokyo (JP)

(72) Inventors: Yuta Sukegawa, Tokyo (JP); Arisa Yamauchi, Tokyo (JP); Mika Tanaka, Tokyo (JP); Tomoki Hirai, Tokyo (JP); Yuji Noguchi, Tokyo (JP); Yusuke Kondo, Tokyo (JP); Michitoshi Arata, Tokyo (JP); Masashi Yamaura, Tokyo (JP); Ayumi Nakayama, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 472 days.

(21) Appl. No.: 18/039,957

(22) PCT Filed: Dec. 10, 2021

(86) PCT No.: PCT/JP2021/045521

§ 371 (c)(1),
(2) Date: Jun. 1, 2023

(87) PCT Pub. No.: WO2022/124396

PCT Pub. Date: Jun. 16, 2022

(65) Prior Publication Data

US 2024/0034833 A1 Feb. 1, 2024

(30) Foreign Application Priority Data

Dec. 11, 2020 (WO) .................. PCT/JP2020/046412
Apr. 28, 2021 (WO) .................. PCT/JP2021/017047

(51) Int. Cl.

| | |
|---|---|
| ***C08G 59/38*** | (2006.01) |
| ***C08G 59/40*** | (2006.01) |
| ***C08G 59/42*** | (2006.01) |
| ***C08G 59/62*** | (2006.01) |
| ***C08G 59/68*** | (2006.01) |
| ***C08K 3/22*** | (2006.01) |
| ***C08K 3/24*** | (2006.01) |
| ***C08K 3/36*** | (2006.01) |
| ***C08L 63/00*** | (2006.01) |
| ***C08L 101/00*** | (2006.01) |
| ***C09K 3/10*** | (2006.01) |
| ***H01Q 1/40*** | (2006.01) |
| ***H10W 74/47*** | (2026.01) |

(52) U.S. Cl.

CPC ............ *C08G 59/38* (2013.01); *C08G 59/40* (2013.01); *C08G 59/42* (2013.01); *C08G 59/621* (2013.01); *C08G 59/688* (2013.01); *C08K 3/22* (2013.01); *C08K 3/24* (2013.01); *C08K 3/36* (2013.01); *C08L 63/00* (2013.01); *C08L 101/00* (2013.01); *C09K 3/10* (2013.01); *H10W 74/473* (2026.01); *C08K 2003/2227* (2013.01); *C08K 2003/2237* (2013.01); *C08K 2201/003* (2013.01); *C08K 2201/005* (2013.01); *C08K 2201/014* (2013.01); *C09K 2200/0239* (2013.01); *C09K 2200/0647* (2013.01); *H01Q 1/40* (2013.01)

(58) Field of Classification Search

CPC ...... C08G 59/38; C08G 59/42; C08G 59/621; C08G 59/688; C08G 59/40; C08K 3/22; C08K 3/36; C08K 3/24; C08K 2003/2227; C08K 2003/2237; C08K 2201/005; C08K 2201/003; C08K 2201/014; C08L 63/00; C08L 101/00; C09K 3/10; C09K 2200/0239; C09K 2200/0647; H01L 23/295; H01Q 1/40

See application file for complete search history.

(56) References Cited

U.S. PATENT DOCUMENTS

| | | | | |
|---|---|---|---|---|
| 9,090,479 B2 | 7/2015 | Kuroda et al. | | |
| 10,594,019 B2 | 3/2020 | Baks et al. | | |
| 2002/0009577 A1* | 1/2002 | Takaya | H03H 7/0115 | 428/209 |
| 2013/0337229 A1* | 12/2013 | Kobayashi | B32B 15/08 | 428/149 |
| 2017/0121520 A1 | 5/2017 | Tan et al. | | |
| 2018/0025999 A1 | 1/2018 | Yu et al. | | |
| 2020/0008298 A1 | 1/2020 | Yoneda et al. | | |

FOREIGN PATENT DOCUMENTS

| | | |
|---|---|---|
| CN | 102186776 | 9/2011 |
| CN | 103351581 | 10/2013 |
| CN | 104194271 | 12/2014 |
| CN | 112771094 | 5/2021 |
| JP | H079609 | 1/1995 |
| JP | H10158472 | 6/1998 |
| JP | 2001192536 | 7/2001 |
| JP | 2002231052 | 8/2002 |
| JP | 2003147171 | 5/2003 |
| JP | 2004035858 | 2/2004 |
| JP | 2006089530 | 4/2006 |
| JP | 2006100258 | 4/2006 |
| JP | 2006225484 | 8/2006 |
| JP | 2009073987 | 4/2009 |
| JP | 2012216685 | 11/2012 |
| JP | 2012246367 | 12/2012 |
| JP | 2014098103 | 5/2014 |
| JP | 2014114352 | 6/2014 |
| JP | 2015036410 | 2/2015 |
| JP | 2017014406 | 1/2017 |

(Continued)

OTHER PUBLICATIONS

Machine English translation of JP 1995-009609, Negishi et al., Jan. 13, 1995.*

(Continued)

*Primary Examiner* — Patrick D Niland
(74) *Attorney, Agent, or Firm* — JCIPRNET

(57) ABSTRACT

A resin composition for molding and an electronic component device are provided. The resin composition for molding includes: a curable resin; and an inorganic filler including a calcium titanate particle.

18 Claims, 2 Drawing Sheets

(56) References Cited

FOREIGN PATENT DOCUMENTS

| | | |
|---|---|---|
| JP | 2017037287 | 2/2017 |
| JP | 2017057268 | 3/2017 |
| JP | 2017528530 | 9/2017 |
| JP | 2018093491 | 6/2018 |
| JP | 2018141052 | 9/2018 |
| JP | 2019104887 | 6/2019 |
| TW | 201719280 | 6/2017 |
| TW | 202024167 | 7/2020 |
| WO | 2010027074 | 3/2010 |
| WO | 2019150994 | 8/2019 |
| WO | 2020066049 | 4/2020 |
| WO | 2020066856 | 4/2020 |

OTHER PUBLICATIONS

Machine English translation of JP 2017037287, Funakoshi et al., Feb. 16, 2017.*

Zhang; Yueping et al., "An Overview of the Development of Antenna-in-Package Technology for Highly Integrated Wireless Devices", Proceedings of the IEEE, Aug. 27, 2019, pp. 2265-2280, vol. 107, Issue.11.

* cited by examiner

RESIN COMPOSITION FOR MOLDING AND ELECTRONIC COMPONENT DEVICE

CROSS-REFERENCE TO RELATED APPLICATION

This application is a 371 application of the International PCT application serial no. PCT/JP2021/045521, filed on Dec. 10, 2021, which claims the priority benefits of International PCT application serial no. PCT/JP2020/046412, filed on Dec. 11, 2020 and International PCT application serial no. PCT/JP2021/017047, filed on Apr. 28, 2021. The entirety of each of the above-mentioned patent applications is hereby incorporated by reference herein and made a part of this specification.

TECHNICAL FIELD

The present disclosure relates to a resin composition for molding and an electronic component device.

BACKGROUND ART

In recent years, with the demand for highly functional, light, thin, short, and small electronic devices, high-density integration and high-density mounting of electronic components have progressed, and semiconductor packages used in these electronic devices are becoming smaller and smaller than ever before. Furthermore, the frequency of radio waves used for communication of electronic devices is also increasing.

From the viewpoints of dealing with the high frequency and the miniaturization of semiconductor packages, high dielectric constant resin compositions used for sealing semiconductor elements (for example, refer to Japanese Patent Laid-Open No. 2015-036410, Japanese Patent Laid-Open No. 2017-057268, and Japanese Patent Laid-Open No. 2018-141052) have been proposed.

SUMMARY OF INVENTION

Technical Problem

Examples of materials for sealing electronic components such as semiconductor elements include a resin composition for molding containing a curable resin and an inorganic filler. By using a composition from which a cured product having a high dielectric constant can be obtained as the above-described resin composition for molding, it is possible to reduce the size of semiconductor packages.

On the other hand, in general, a material having a high dielectric constant often has a high dielectric loss tangent. If a material having a high dielectric loss tangent is used, transmission signals are converted into heat due to transmission loss, and communication efficiency is likely to decrease. Here, the amount of transmission loss generated through heat conversion of radio waves transmitted from communication in a dielectric is expressed as the product of the frequency, the square root of a relative dielectric constant, and the dielectric loss tangent. That is, the transmission signal is likely to be converted into heat proportionally to the frequency. In particular, in recent years, the frequency of radio waves used for communication is increased in order to cope with an increase in the number of channels due to diversification of information. For this reason, a resin composition for molding in which both a high dielectric constant and a low dielectric loss tangent are achieved in a cured product after molding is required.

An objective of the present disclosure is to provide a resin composition for molding in which both a high dielectric constant and a low dielectric loss tangent are achieved in a cured product after molding, and an electronic component device using the same.

Solution to Problem

Specific means for solving the objective includes the following aspects.

<1> A resin composition for molding including: a curable resin; and an inorganic filler containing calcium titanate particles.

<2> The resin composition for molding according to <1>, further including: a curing agent, in which the curable resin includes an epoxy resin.

<3> The resin composition for molding according to <2>, in which the curing agent includes an active ester compound.

<4> The resin composition for molding according to <2> or <3>, in which the curing agent includes an active ester compound and at least one of other curing agents selected from the group consisting of a phenol curing agent, an amine curing agent, an acid anhydride curing agent, a polymercaptan curing agent, a polyaminoamide curing agent, an isocyanate curing agent, and a blocked isocyanate curing agent.

<5> The resin composition for molding according to <2> or <3>, in which the curing agent includes an aralkyl-type phenol resin and an active ester compound.

<6> The resin composition for molding according to any one of <1> to <5>, in which the inorganic filler further includes another inorganic filler which is at least one selected from the group consisting of silica particles and alumina particles.

<7> The resin composition for molding according to <6>, in which the other inorganic filler has a volume average particle diameter of 3 μm or more.

<8> The resin composition for molding according to any one of <1> to <7>, in which a content of the calcium titanate particles is 30% by volume to 80% by volume with respect to all the inorganic fillers.

<9> The resin composition for molding according to any one of <1> to <8>, in which relative dielectric constants of all the inorganic fillers at 10 GHz is 80 or less.

<10> The resin composition for molding according to any one of <1> to <9>, in which a total content of the inorganic fillers is 40% by volume to 85% by volume with respect to the entire resin composition for molding.

<11> The resin composition for molding according to any one of <1> to <10>, in which the calcium titanate particles have a volume average particle diameter of 0.2 μm to 80 μm.

<12> the resin composition for molding according to any one of <1> to <11>, further including: a curing promoter containing organic phosphine.

<13> The resin composition for molding according to any one of <1> to <12>, in which the inorganic fillers contain spherical calcium titanate particles.

<14> The resin composition for molding according to <13>, in which a total content of the inorganic fillers is 70% by volume to 85% by volume with respect to the entire resin composition for molding.

<15> The resin composition for molding according to any one of <1> to <14>, in which a cured product of the resin composition for molding has a relative dielectric constant of 9 to 40 and a dielectric loss tangent of 0.020 or less.

<16> The resin composition for molding according to any one of <1> to <15>, which is used in a high frequency device.

<17> The resin composition for molding according to <16>, which is used for sealing an electronic component in a high-frequency device.

<18> The resin composition for molding according to any one of <1> to <17>, which is used in an antenna-in-package.

<19> An electronic component device including: a support member; an electronic component placed on the support member; and a cured product of the resin composition for molding according to any one of <1> to <18> which seals the electronic component.

<20> The electronic component device according to <19>, in which the electronic component includes an antenna.

Advantageous Effects of Invention

According to the present disclosure, there is provided a resin composition for molding in which both a high dielectric constant and a low dielectric loss tangent are achieved in a cured product after molding, and an electronic component device using the same.

DESCRIPTION OF EMBODIMENTS

Figure 1:
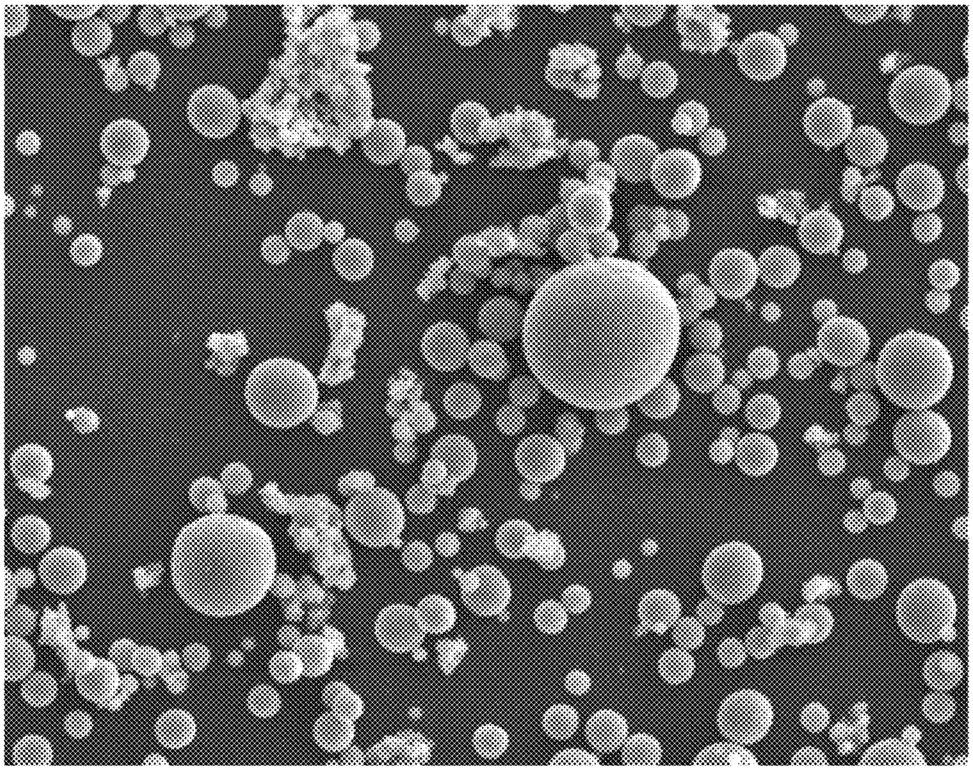
FIG. 1 is an SEM photograph of calcium titanate particles subjected to spheroidizing treatment.

In the present disclosure, the term "step" also includes, in addition to a step independent of other steps, a step that cannot be clearly distinguished from other steps as long as the purpose of the step is achieved.

In the present disclosure, a numerical range indicated using "to" includes numerical values denoted before and after "to" as a minimum value and a maximum value.

In a numerical range denoted stepwise in the present disclosure, an upper limit value or a lower limit value denoted in one numerical range may be substituted with an upper limit value or a lower limit value of another stepwise numerical range denoted. In addition, in a numerical range denoted in the present disclosure, an upper limit value or a lower limit value of the numerical range may be substituted with values shown in examples.

Each component in the present disclosure may contain plural kinds of corresponding substances. In a case where plural kinds of substances corresponding to each component are present in a composition, the content of each component means a total content of the plural kinds of corresponding substances present in the composition unless otherwise specified.

In the present disclosure, there may be plural kinds of particles corresponding to components. In a case where plural kinds of particles corresponding to components are present in a composition, the particle diameter of each component means a value regarding a mixture of the plural kinds of corresponding particles present in the composition unless otherwise specified.

In the present disclosure, a simple description of "calcium titanate particles" means calcium titanate particles having an arbitrary shape such as a spherical shape, an elliptical shape, or an amorphous shape, or a mixture thereof.

Hereinafter, aspects for implementing the present disclosure will be described in detail. However, the present disclosure is not limited to the following embodiments. Constituent elements (including an element step or the like) in the following embodiments are not essential unless otherwise specified. The same applies to numerical values and ranges thereof which do not limit the present disclosure.

<Resin Composition for Molding>

A resin composition for molding according to one embodiment of the present invention includes: a curable resin; and an inorganic filler containing calcium titanate particles.

As described above, in the resin composition for molding, it is required for both a high dielectric constant and a low dielectric loss tangent to be achieved in a cured product after molding. For example, barium titanate can be considered as a material from which a high dielectric constant can be obtained. However, when barium titanate is used, not only the dielectric constant but also a dielectric loss tangent is likely to increase.

On the other hand, if the calcium titanate is used, it has been found that it is possible to increase the dielectric constant and suppress increase in the dielectric loss tangent compared to the case where barium titanate is used. That is, in the present embodiment, an inorganic filler containing calcium titanate particles is used so that a cured product in which both a high dielectric constant and a low dielectric loss tangent are achieved is obtained compared to a case where barium titanate is used.

Hereinafter, each component constituting the resin composition for molding will be described. The resin composition for molding of the present embodiment may contain a curable resin and an inorganic filler, and may contain other components as necessary.

(Curable Resin)

The resin composition for molding in the present embodiment contains a curable resin.

The curable resin may be either a thermosetting resin or a photocurable resin, and is preferably a thermosetting resin from the viewpoint of mass productivity.

Examples of thermosetting resins include an epoxy resin, a phenolic resin, a melamine resin, a urea resin, an unsaturated polyester resin, an alkyd resin, a urethane resin, a polyimide resin such as a bismaleimide resin, polyamide resin, a polyamideimide resin, a silicone resin, and an acrylic resin. From the viewpoints of moldability and electrical properties, the thermosetting resin is preferably at least one selected from the group consisting of an epoxy resin and a polyimide resin, more preferably at least one selected from the group consisting of an epoxy resin and a bismaleimide resin, and still more preferably an epoxy resin.

The resin composition for molding may contain only one kind or two or more kinds of curable resins.

Hereinafter, an epoxy resin will be described as an example of the curable resin.

—Epoxy Resin—

The resin composition for molding preferably contains an epoxy resin as a curable resin.

In a case where the resin composition for molding contains an epoxy resin as a curable resin, the content of the epoxy resin with respect to the entire curable resin is preferably 80 mass % or higher, more preferably 90 mass % or higher, and still more preferably 95 mass % or higher. The content of the epoxy resin with respect to the entire curable resin may be 100 mass %.

The type of epoxy resin is not particularly limited as long as an epoxy resin has an epoxy group in a molecule.

Specific examples of epoxy resins include: novolac-type epoxy resins (such as a phenol novolac-type epoxy resin and an ortho-cresol novolac epoxy resin) which are obtained by epoxidizing a novolac resin and condensing and co-condensing at least one phenolic compound selected from the group consisting of a phenol compound such as phenol, cresol, xylenol, resorcin, catechol, bisphenol A, or bisphenol F and a naphthol compound such as α-naphthol, β-naphthol, or dihydroxynaphthalene, and an aliphatic aldehyde compound such as formaldehyde, acetaldehyde, or propionaldehyde in the presence of an acidic catalyst; triphenylmethane-type epoxy resins which are obtained by epoxidizing triphenylmethane-type phenol resins and condensing or co-condensing the above-described phenolic compound and an aromatic aldehyde compound such as benzaldehyde or salicylaldehyde in the presence of an acidic catalyst; copolymerization-type epoxy resins which are obtained by epoxidizing novolac resins and co-condensing the above-described phenol compounds and naphthol compounds, and an aldehyde compound in the presence of an acidic catalyst; diphenylmethane-type epoxy resins which are diglycidyl ethers of bisphenol A and bisphenol F; biphenyl-type epoxy resins which are diglycidyl ethers of alkyl-substituted or unsubstituted biphenyl; stilbene-type epoxy resins such as diglycidyl ethers of stilbene-based phenol compounds; sulfur atom-containing epoxy resins which are diglycidyl ethers of bisphenol S; epoxy resins which are glycidyl ethers of alcohols such as butanediol, polyethylene glycol, and polypropylene glycol; glycidyl ester-type epoxy resins which are glycidyl esters of polyhydric carboxylic acid compounds such as phthalic acid, isophthalic acid, and tetrahydrophthalic acid; glycidyl amine-type epoxy resins obtained by substituting active hydrogen bound to a nitrogen atom of aniline, diaminodiphenylmethane, isocyanuric acid, or the like with a glycidyl group; dicyclopentadiene-type epoxy resins obtained by epoxidizing a co-condensation resin of dicyclopentadiene and a phenol compound; alicyclic epoxy resins such as vinylcyclohexene diepoxide, 3,4-epoxycyclohexylmethyl-3,4-epoxycyclohexanecarboxylate, and 2-(3,4-epoxy)cyclohexyl-5,5-spiro(3,4-epoxy)cyclohexane-m-dioxane which are obtained by epoxidizing an olefin bond in a molecule; para-xylene-modified epoxy resins which are glycidyl ethers of para-xylene-modified phenol resins; meta-xylene-modified epoxy resins which are glycidyl ethers of meta-xylene-modified phenol resins; terpene-modified epoxy resins which are glycidyl ethers of terpene-modified phenol resins; dicyclopentadiene-modified epoxy resins which are glycidyl ethers of dicyclopentadiene-modified phenol resins; cyclopentadiene-modified epoxy resins which are glycidyl ethers of cyclopentadiene-modified phenol resins; polycyclic aromatic ring-modified epoxy resins which are glycidyl ethers of polycyclic aromatic ring-modified phenol resins; naphthalene-type epoxy resins which are glycidyl ethers of naphthalene-containing phenol resins; halogenated phenol novolac-type epoxy resins; hydroquinone-type epoxy resins; trimethylolpropane-type epoxy resins; linear aliphatic epoxy resins obtained by oxidizing an olefin bond with a peracid such as peracetic acid; and aralkyl-type epoxy resins obtained by epoxidizing aralkyl-type phenol resins such as a phenol aralkyl resin and a naphthol aralkyl resin. Furthermore, an epoxidized material or the like of an acrylic resin may also be exemplified as an epoxy resin. These epoxy resins may be used alone or in a combination of two or more thereof.

The epoxy equivalent (molecular weight/number of epoxy groups) of an epoxy resin is not particularly limited. From the viewpoints of balancing various characteristics such as moldability, reflow resistance, and electrical reliability, the epoxy equivalent of an epoxy resin is preferably 100 g/eq to 1,000 g/eq and more preferably 150 g/eq to 500 g/eq.

A value measured through a method according to JIS K 7236:2009 is used as an epoxy equivalent of an epoxy resin.

In a case where an epoxy resin is a solid, the softening point or the melting point of an epoxy resin is not particularly limited. The softening point or the melting point of an epoxy resin is preferably 40° C. to 180° C. from the viewpoints of moldability and reflow resistance and more preferably 50° C. to 130° C. from the viewpoint of handleability when preparing a resin composition for molding.

A value measured through differential scanning calorimetry (DSC) or a method (ring and ball method) according to JIS K 7234:1986 is used as a melting point or a softening point of an epoxy resin.

In the case where the resin composition for molding contains an epoxy resin as a curable resin, the mass proportion of the epoxy resin in the total amount of the resin composition for molding is, from the viewpoints of strength, fluidity, heat resistance, moldability, and the like, preferably 0.5 mass % to 30 mass %, more preferably 2 mass % to 20 mass %, and still more preferably 3.5 mass % to 13 mass %.

—Curing Agent—

In a case where the resin composition for molding contains an epoxy resin as a curable resin, the resin composition for molding may further contain a curing agent. The resin composition for molding preferably contains a curable resin including an epoxy resin; a curing agent; and an inorganic filler containing calcium titanate particles. The type of curing agent is not particularly limited.

A curing agent preferably includes an active ester compound. The active ester compound may be used alone or in a combination of two or more thereof. Here, the active ester compound refers to a compound which has one or more ester groups reacting with an epoxy group in one molecule and has an action of curing an epoxy resin. In a case where a curing agent includes an active ester compound, the curing agent may or may not include a curing agent in addition to the active ester compound.

If an active ester compound is used as a curing agent, the dielectric loss tangent of a cured product can be reduced to a low level compared to a case where a phenol curing agent or an amine curing agent is used as a curing agent. The reason is assumed as follows.

In a reaction between an epoxy resin and a phenol curing agent or an amine curing agent, a secondary hydroxyl group is produced. On the other hand, in a reaction between an epoxy resin and an active ester compound, an ester group is produced instead of a secondary hydroxyl group. Since an ester group has a lower polarity than a secondary hydroxyl group, a resin composition for molding containing an active ester compound as a curing agent can reduce the dielectric loss tangent of a cured product to a low level compared to a resin composition for molding containing only a curing agent that produces a secondary hydroxyl group as a curing agent.

In addition, since a polar group in a cured product enhances water absorbability of the cured product, the concentration of the polar group in the cured product can be reduced and the water absorbability of the cured product can be suppressed using an active ester compound as a curing agent. By suppressing the water absorbability of a cured product, that is, by suppressing the content of $H_2O$ which is a polar molecule, the dielectric loss tangent of the cured product can be further reduced to a low level.

The type of active ester compound is not particularly limited as long as it is a compound having one or more ester groups reacting with an epoxy group in a molecule. Examples of active ester compounds include a phenol ester compound, a thiophenol ester compound, an N-hydroxyamine ester compound, and an ester compound of a heterocyclic hydroxy compound.

Examples of active ester compounds include an ester compound obtained from at least one kind of an aliphatic carboxylic acid or an aromatic carboxylic acid and at least one kind of an aliphatic hydroxy compound or an aromatic hydroxy compound. Ester compounds which have aliphatic compounds as components of polycondensation and have aliphatic chains tend to have excellent compatibility with epoxy resins. Ester compounds which have aromatic compounds as components of polycondensation and have aromatic rings tend to have excellent heat resistance.

Specific examples of active ester compounds include aromatic esters obtained by a condensation reaction between aromatic carboxylic acids and phenolic hydroxyl groups. Among these, aromatic esters obtained by a condensation reaction between aromatic carboxylic acids and phenolic hydroxyl groups using a mixture of an aromatic carboxylic acid component in which 2 to 4 hydrogen atoms of aromatic rings such as benzene, naphthalene, biphenyl, diphenylpropane, diphenylmethane, diphenyl ethers, and diphenyl sulfonic acid are substituted with carboxy groups, a monovalent phenol in which one hydrogen atom of the aromatic ring is substituted with a hydroxyl group, and a polyhydric phenol in which 2 to 4 hydrogen atoms of the aromatic rings are substituted with hydroxyl groups as a raw material are preferable. That is, aromatic esters having a structural unit derived from the above-described aromatic carboxylic acid component, a structural unit derived from the above-described monovalent phenol, and a structural unit derived from the above-described polyhydric phenol are preferable.

Specific examples of active ester compounds include an active ester resin which is disclosed in Japanese Patent Laid-Open No. 2012-246367 and has a structure obtained by reacting a phenol resin having a molecular structure in which a phenol compound is knotted via an alicyclic hydrocarbon group, an aromatic dicarboxylic acid or a halide thereof, and an aromatic monohydroxy compound. Compounds represented by Structural Formula (1) below are preferable as the active ester resins.

[Chem. 1]

(1)

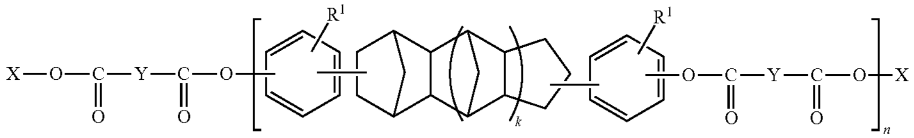

In Structural Formula (1), $R^1$ is an alkyl group having 1 to 4 carbon atoms, X is an unsubstituted benzene ring, an unsubstituted naphthalene ring, a benzene ring or a naphthalene ring substituted with an alkyl group having 1 to 4 carbon atoms, or a biphenyl group, Y is a benzene ring, a naphthalene ring, or a benzene ring or a naphthalene ring substituted with an alkyl group having 1 to 4 carbon atoms, k is 0 or 1, and n is 0.25 to 10 representing an average repeating number.

Specific examples of the compounds represented by Structural Formula (1) include exemplary compounds (1-1) to (1-10) below. t-Bu in the structural formulae is a tert-butyl group.

[Chem. 2]

(1-1)

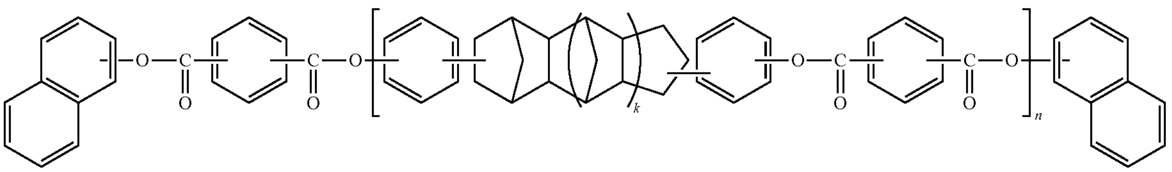

(1-2)

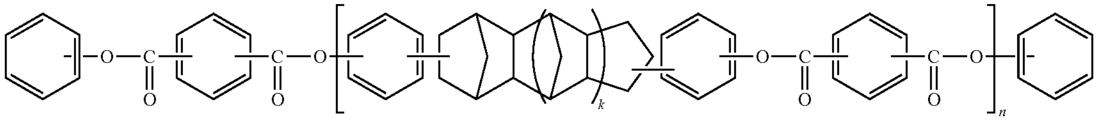

-continued
(1-3)
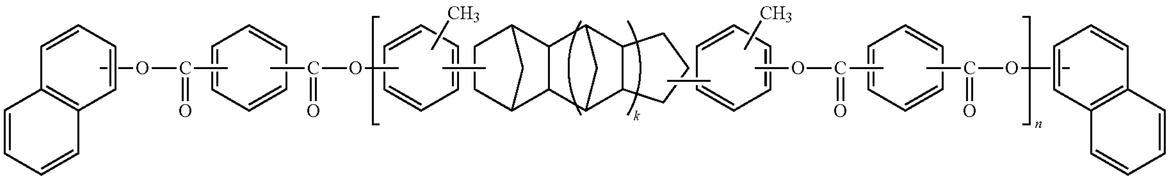
(1-4)
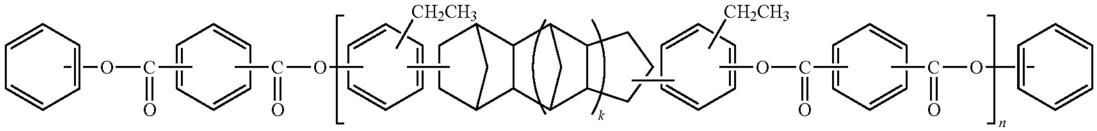
(1-5)
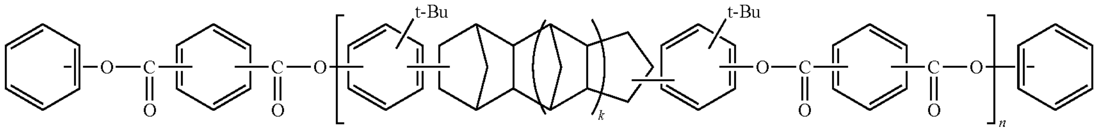
(1-6)
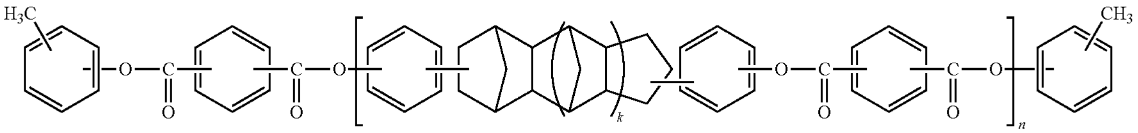
[Chem. 3]
(1-7)
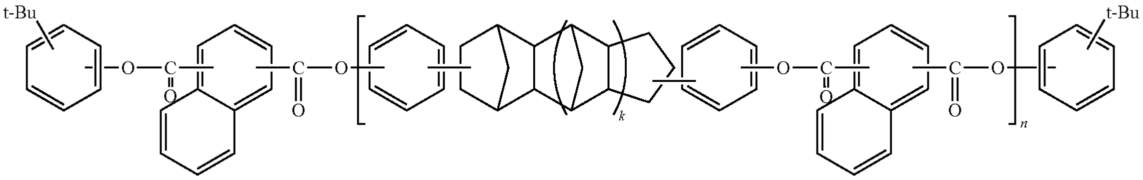
(1-8)
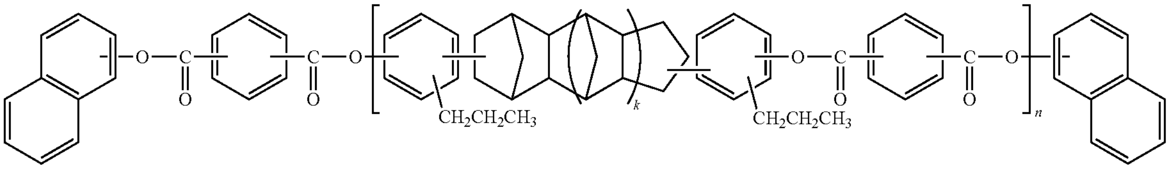
(1-9)
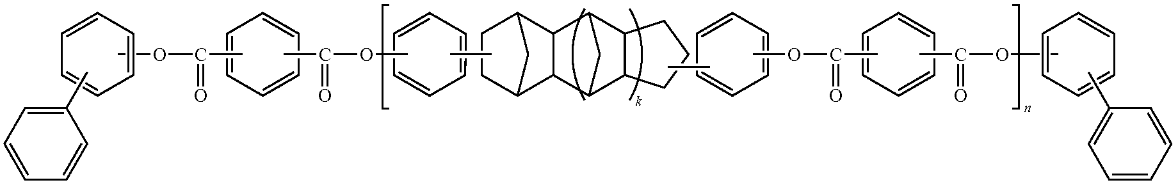
(1-10)
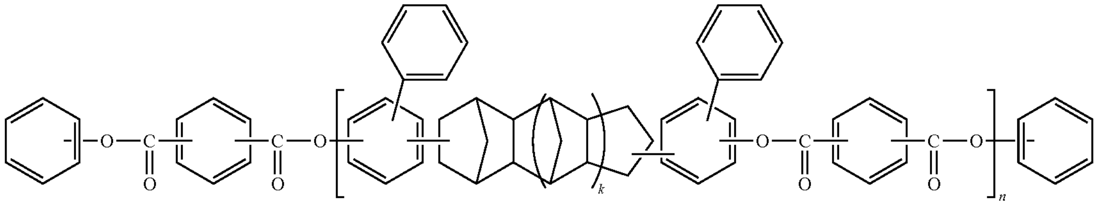

Specific examples of other active ester compounds include compounds represented by Structural Formula (2) below and compounds represented by Structural Formula (3) below which are disclosed in Japanese Patent Laid-Open No. 2014-114352.

[Chem. 4]

(2)

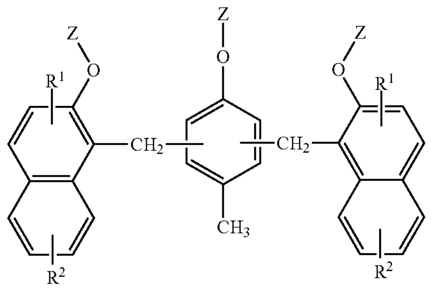

(3)

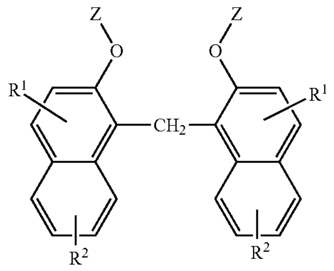

In Structural Formula (2), $R^1$ and $R^2$ each independently represent a hydrogen atom, an alkyl group having 1 to 4 carbon atoms, or an alkoxy group having 1 to 4 carbon atoms, and Z is an ester-forming structure moiety (z1) selected from the group consisting of an unsubstituted benzoyl group, an unsubstituted naphthoyl group, a benzoyl group or a naphthoyl group substituted with an alkyl group having 1 to 4 carbon atoms, and an acyl group having 2 to 6 carbon atoms, or a hydrogen atom (z2), in which at least one Z is the ester-forming structure moiety (z1).

In Structural Formula (3), $R^1$ and $R^2$ each independently represent a hydrogen atom, an alkyl group having 1 to 4 carbon atoms, or an alkoxy group having 1 to 4 carbon atoms, and Z is an ester-forming structure moiety (z1) selected from the group consisting of an unsubstituted benzoyl group, an unsubstituted naphthoyl group, a benzoyl group or a naphthoyl group substituted with an alkyl group having 1 to 4 carbon atoms, and an acyl group having 2 to 6 carbon atoms, or a hydrogen atom (z2), in which at least one Z is the ester-forming structure moiety (z1).

Specific examples of the compounds represented by Structural Formula (2) include exemplary compounds (2-1) to (2-6) below.

[Chem. 5]

(2-1)

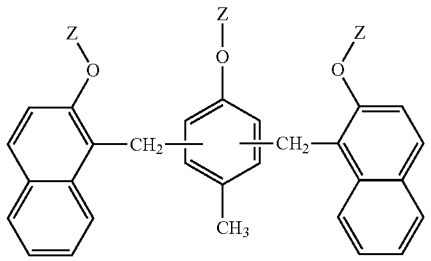

(2-2)

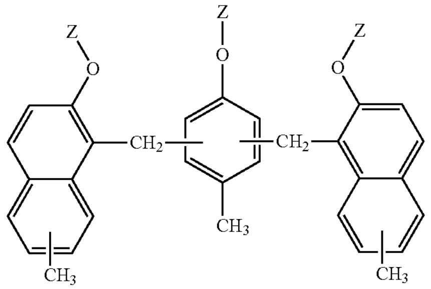

(2-3)

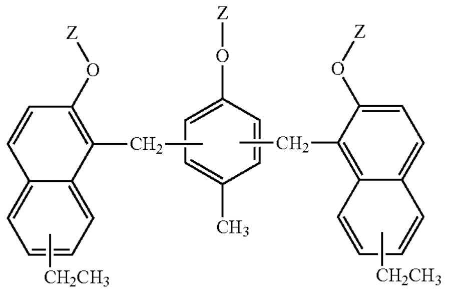

(2-4)

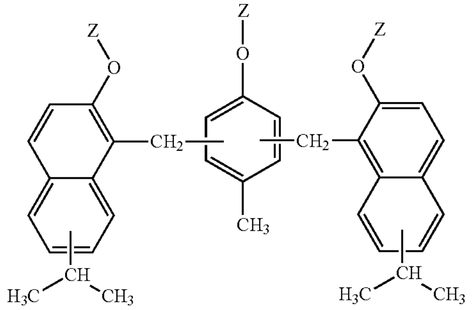

(2-5)

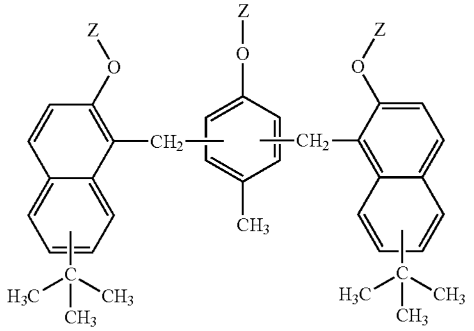

-continued (2-6)

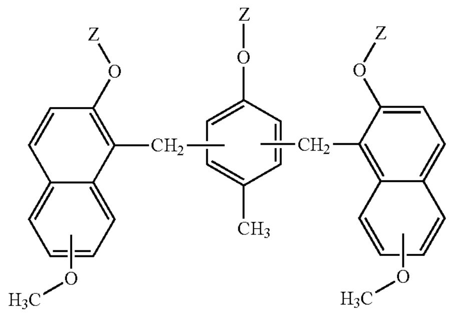

Specific examples of the compounds represented by Structural Formula (3) include exemplary compounds (3-1) to (3-6) below.

[Chem. 6]

(3-1)

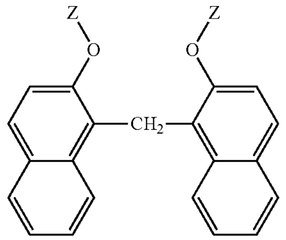

(3-2)

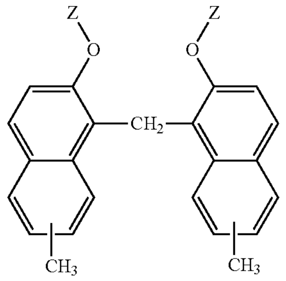

(3-3)

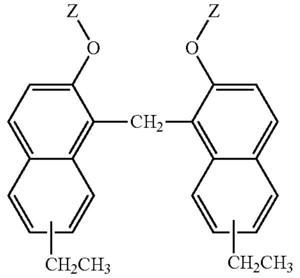

(3-4)

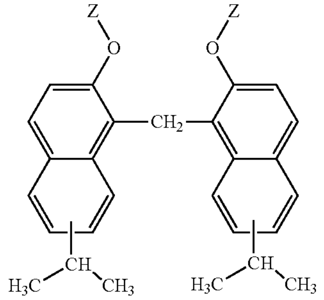

-continued (3-5)

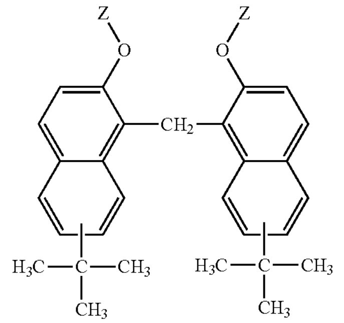

(3-6)

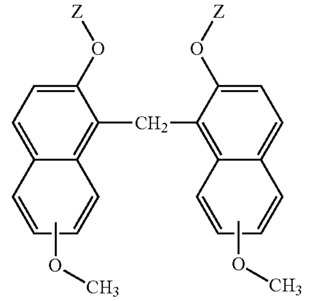

Commercially available products may be used as active ester compounds. Examples of commercially available products of active ester compounds include "EXB9451," "EXB9460," "EXB9460S," and "HPC-8000-65T" (manufactured by DIC Corporation) as active ester compounds having a dicyclopentadiene-type diphenol structure; "EXB9416-70BK," "EXB-8," and "EXB-9425" (manufactured by DIC Corporation) as active ester compounds having an aromatic structure; "DC808" (manufactured by Mitsubishi Chemical Corporation) as an active ester compound containing a phenol novolac acetylated product; and "YLH1026" (manufactured by Mitsubishi Chemical Corporation) as an active ester compound containing a benzoylated product of phenol novolac.

The ester equivalent (molecular weight/number of ester groups) of an active ester compound is not particularly limited. From the viewpoints of balancing various characteristics such as moldability, reflow resistance, and electrical reliability, the ester equivalent thereof is preferably 150 g/eq to 400 g/eq, more preferably 170 g/eq to 300 g/eq, and still more preferably 200 g/eq to 250 g/eq.

A value measured through a method according to JIS K 0070:1992 is used as an ester equivalent of an active ester compound.

The equivalent ratio (ester group/epoxy group) of an active ester compound to an epoxy resin is, from the viewpoint of reducing the dielectric loss tangent of a cured product to a low level, preferably 0.9 or more, more preferably 0.95 or more, and still more preferably 0.97 or more.

The equivalent ratio (ester group/epoxy group) of an active ester compound to an epoxy resin is, from the viewpoint of reducing the content of active ester compound unreacted, preferably 1.1 or less, more preferably 1.05 or less, and still more preferably 1.03 or less.

A curing agent may include other curing agents in addition to the active ester compound. The types of other curing agents are not particularly limited and can be selected according to desired properties of a resin composition for molding. Examples of other curing agents include a phenol curing agent, an amine curing agent, an acid anhydride curing agent, a polymercaptan curing agent, a polyaminoamide curing agent, an isocyanate curing agent, and a blocked isocyanate curing agent.

Specific examples of phenol curing agents include polyhydric phenol compounds such as resorcin, catechol, bisphenol A, bisphenol F, and substituted or unsubstituted biphenol; novolac-type phenol resins obtained by condensing or co-condensing at least one phenolic compound selected from the group consisting of a phenol compound such as phenol, cresol, xylenol, resorcin, catechol, bisphenol A, bisphenol F, phenylphenol, or aminophenol and a naphthol compound such as α-naphthol, β-naphthol, or dihydroxynaphthalene, and an aldehyde compound such as formaldehyde, acetaldehyde, or propionaldehyde in the presence of an acidic catalyst; aralkyl-type phenol resins such as naphthol aralkyl resins and phenol aralkyl resins synthesized from dimethoxy para-xylene, bis(methoxymethyl)biphenyl, and the like and the above-described phenolic compounds; para-xylene-modified phenol resins and meta-xylene-modified phenol resins; melamine-modified phenol resins; terpene-modified phenol resins; dicyclopentadiene-type naphthol resins and dicyclopentadiene-type phenol resins synthesized through copolymerization of dicyclopentadiene and the above-described phenolic compounds; cyclopentadiene-modified phenol resins; polycyclic aromatic ring-modified phenol resins; biphenyl-type phenol resins; triphenylmethane-type phenol resins and condensing or co-condensing the above-described phenolic compounds and an aromatic aldehyde compound such as benzaldehyde or salicylaldehyde in the presence of an acidic catalyst; and phenol resins obtained through copolymerization of two or more of these. These phenol curing agents may be used alone or in a combination of two or more thereof.

The functional group equivalents (the hydroxyl equivalent in a case of a phenol curing agent) of other curing agents are not particularly limited. From the viewpoints of balancing various characteristics such as moldability, reflow resistance, and electrical reliability, the functional group equivalents of other curing agents are preferably 70 g/eq to 1,000 g/eq and more preferably 80 g/eq to 500 g/eq.

Values measured through a method according to JIS K0070:1992 are used as functional group equivalents (a hydroxyl equivalent in a case of a phenol curing agent) of other curing agents.

The softening point or the melting point of a curing agent is not particularly limited. The softening point or the melting point of a curing agent is preferably 40° C. to 180° C. from the viewpoints of moldability and reflow resistance and more preferably 50° C. to 130° C. from the viewpoint of handleability when producing a resin composition for molding.

A value measured in the same manner as the melting point or the softening point of an epoxy resin is used as a melting point or a softening point of a curing agent.

The equivalent ratio of an epoxy resin to a curing agent (all curing agents in a case where plural kinds of curing agents are used), that is, the ratio (number of functional groups in curing agent/number of functional groups in epoxy resin) of the number of functional groups in a curing agent to the number of functional groups in an epoxy resin, is not particularly limited. From the viewpoint of reducing unreacted contents, the ratio is preferably set in a range of 0.5 to 2.0 and more preferably set in a range of 0.6 to 1.3. From the viewpoints of moldability and reflow resistance, the ratio is more preferably set in a range of 0.8 to 1.2.

Curing agents include an active ester compound and at least one of other curing agents selected from the group consisting of a phenol curing agent, an amine curing agent, an acid anhydride curing agent, a polymercaptan curing agent, a polyaminoamide curing agent, an isocyanate curing agent, and a blocked isocyanate curing agent. From the viewpoint of excellent bending toughness after curing a resin composition for molding, a curing agent may include a phenol curing agent and an active ester compound, or may include an aralkyl-type phenol resin and an active ester compound.

Hereinafter, other curing agents may be read as phenol curing agents.

In a case where a curing agent includes an active ester compound and other curing agents, the mass proportion of the active ester compound in the total amount of the active ester compound and the other curing agents is, from the viewpoint of reducing the dielectric loss tangent of a cured product to a low level, preferably 40 mass % or more, more preferably 60 mass % or more, still more preferably 80 mass % or more, particularly preferably 85 mass % or more, and significantly preferably 90 mass % or more.

In the case where a curing agent includes an active ester compound and other curing agents, the total mass proportion of an epoxy resin and the active ester compound in the total amount of the epoxy resin and the curing agent is, from the viewpoint of reducing the dielectric loss tangent of a cured product to a low level, preferably 40 mass % or more, more preferably 60 mass % or more, still more preferably 80 mass % or more, particularly preferably 85 mass % or more, and significantly preferably 90 mass % or more.

In the case where a curing agent includes an active ester compound and other curing agents, the mass proportion of the active ester compound in the total amount of the active ester compound and the other curing agents is, from the viewpoints of excellent bending toughness after a resin composition for molding is cured and reducing the dielectric loss tangent of a cured product to a low level, preferably 40 mass % to 90 mass %, more preferably 50 mass % to 80 mass %, and still more preferably 55 mass % to 70 mass %.

In the case where a curing agent includes an active ester compound and other curing agents, the mass proportion of the other curing agents in the total amount of the active ester compound and the other curing agents is, from the viewpoints of excellent bending toughness after a resin composition for molding is cured and reducing the dielectric loss tangent of a cured product to a low level, preferably 10 mass % to 60 mass %, more preferably 20 mass % to 50 mass %, and still more preferably 30 mass % to 45 mass %.

In a case where a resin composition for molding contains an epoxy resin and a curing agent, the content of a curable resin other than the epoxy resin in the total amount of the resin composition for molding may be less than 5 mass %, may be 4 mass % or less, or may be 3 mass % or less.

—Polyimide Resin—

The resin composition for molding may contain a polyimide resin as a curable resin.

The polyimide resin is not particularly limited as long as it is a polymer compound having an imide bond. Examples of polyimide resins include a bismaleimide resin.

Examples of bismaleimide resins include a copolymer of a compound having two or more N-substituted maleimide groups and a compound having two or more amino groups. Hereinafter, the compound having two or more N-substituted maleimide groups is also referred to as a "polymaleimide compound," and the compound having two or more amino groups is also referred to as a "polyamino compound."

The bismaleimide resin may be a polymer obtained by polymerizing a composition containing a polymaleimide compound and a polyamino compound, or may contain units derived from compounds other than the polymaleimide compound and the polyamino compound. Examples of other compounds include a compound having a group containing two or more ethylenically unsaturated double bonds. Hereinafter, the compound having a group containing two or more ethylenically unsaturated double bonds is also referred to as an "ethylenic compound."

The polymaleimide compound is not limited as long as it is a compound having two or more N-substituted maleimide groups, and may be a compound having two N-substituted maleimide groups or a compound having three or more N-substituted maleimide groups. From the viewpoint of availability, the polymaleimide compound is preferably a compound having two N-substituted maleimide groups.

Specific examples of polymaleimide compounds include bis(4-maleimidophenyl)methane, bis(3-maleimidophenyl) methane, polyphenylmethane maleimide, bis(4-maleimidophenyl)ether, bis(4-maleimidophenyl)sulfone, 3,3'-dimethyl-5,5'-diethyl-4,4'-diphenylmethane bismaleimide, 4-methyl-1,3-phenylene bismaleimide, m-phenylene bismaleimide, p-phenylene bismaleimide, 2,2-bis[4-(4-maleimidophenoxy)phenyl]propane, 1,2-bismaleimidoethane, 1,6-bismaleimidohexane, 1,12-bismaleimidododecane, 1,6-bismaleimido-(2,2,4-trimethyl)hexane, and 1,6-bismaleimido-(2,4,4-trimethyl)hexane.

These polymaleimide compounds may be used alone or in combination of two or more thereof.

The polyamino compound is not limited as long as it is a compound having two or more amino groups, and may be a compound having two amino groups or a compound having three or more amino groups. From the viewpoint of availability, the polyamino compound is preferably a compound having two amino groups.

Examples of polyamino compounds include 4,4'-diaminodiphenylmethane, 4,4'-diamino-3,3'-dimethyl-diphenylmethane, 4,4'-diamino-3,3'-diethyl-diphenylmethane, 4,4'-diaminodiphenylether, 4,4'-diaminodiphenylsulfone, 3,3'-diaminodiphenylsulfone, 4,4'-diaminodiphenylketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3'-dimethyl-5,5'-diethyl-4,4'-diphenylmethanediamine, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis[1-(4-(4-aminophenoxy)phenyl)-1-methylethyl]benzene, 1,4-bis[1-(4-(4-aminophenoxy)phenyl)-1-methylethyl]benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, bis[4-(4-aminophenoxy)phenyl]sulfone, bis[4-(3-aminophenoxy) phenyl]sulfone, and 9,9-bis(4-aminophenyl)fluorene.

These polyamino compounds may be used alone or in combination of two or more thereof.

Examples of "groups containing ethylenically unsaturated double bonds" of ethylenic compounds include a vinyl group, an allyl group, a vinyloxy group, an allyloxy group, an acryloyl group, and a methacryloyl group. An ethylenic compound may have only one group containing ethylenically unsaturated double bonds in one molecule, or may have two or more groups containing ethylenically unsaturated double bonds in one molecule.

The ethylenic compound may further have other groups in addition to the groups containing ethylenically unsaturated double bonds. Examples of other groups include an amino group, an ether group, and a sulfide group.

Specific examples of ethylenic compounds include diallylamine, diallyl ether, diallyl sulfide, and triallyl isocyanurate.

The equivalent ratio (Ta1/Ta2) of the number of N-substituted maleimide groups (Ta1) of a polymaleimide compound to the number of amino groups (Ta2) of a polyamino compound in a bismaleimide resin is preferably within a range of 1.0 to 10.0 and more preferably within a range of 2.0 to 10.0.

In addition, in a case where a bismaleimide resin contains units derived from an ethylenic compound, the equivalent ratio (Ta3/Ta1) of the number of ethylenically unsaturated double bonds (Ta3) of the ethylenic compound to the number of N-substituted maleimide groups (Ta1) of polymaleimide compounds in the bismaleimide resin is within a range of, for example, to 0.2.

The weight-average molecular weight of a bismaleimide resin is not particularly limited, and may be within a range of, for example, 800 to 1,500, 800 to 1,300, or 800 to 1,100.

The weight-average molecular weight of a bismaleimide resin can be obtained by conversion from a calibration curve using standard polystyrene through gel permeation chromatography (GPC).

The calibration curve is approximated by a cubic equation using TSK Standard Polystyrene (Types: A-2500, A-5000, F-1, F-2, F-4, F-10, F-20, and F-40) [manufactured by Tosoh Corporation] which is standard polystyrene.

Devices used for GPC include pump: L-6200 type (manufactured by Hitachi High-Tech Corporation), detector: L-3300 type RI (manufactured by Hitachi High-Tech Corporation), column oven: L-655A-52 (manufactured by Hitachi High-Tech Corporation), guard column: TSK Guard Column HER-L (manufactured by Tosoh Corporation, column size of 6.0×40 mm), and column: TSKgel-G4000Hhr+gel-G2000Hhr (manufactured by Tosoh Corporation, column size of 7.8×300 mm).

Examples of GPC measurement conditions include eluent: tetrahydrofuran, sample concentration: 30 mg/5 mL, injection amount: 20 μL, flow rate: 1.00 mL/minute, and measurement temperature: 40° C.

In the case where the resin composition for molding contains a polyimide resin as a curable resin, the mass proportion of the polyimide resin in the total amount of the resin composition for molding is, for example, 0.5 mass % to 30 mass %, preferably 2 mass % to 20 mass %, and more preferably 3.5 mass % to 13 mass %.

(Curing Promoter)

The resin composition for molding in the present embodiment may contain a curing promoter as necessary. The type of curing promoter is not particularly limited and can be selected according to, for example, the type of curable resin and desired properties of a resin composition for molding.

Examples of curing promoters used in a resin composition for molding containing at least one selected from the group consisting of a polyimide resin and an epoxy resin as curable resins include cyclic amidine compounds such as a diazabicycloalkene including 1,5-diazabicyclo[4.3.0]nonene-5 (DBN), and 1,8-diazabicyclo[5.4.0]undecene-7 (DBU), 2-methylimidazole, 2-phenylimidazole, 2-phenyl-4-methylimidazole, 2-ethyl-4-methylimidazole, and 2-heptadecylimidazole; derivatives of the cyclic amidine compounds; phenol novolac salts of the cyclic amidine compounds or derivatives thereof; compounds with intramolecular polarization obtained by adding a compound having a π bond, such as maleic anhydride, a quinone compound including 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, and phenyl-1,4-benzoquinone, or diazophenylmethane to those compounds; cyclic amidinium compounds such as a tetraphenylborate salt of DBU, a tetraphenylborate salt of DBN, a tetraphenylborate salt of 2-ethyl-4-methylimidazole, and a tetraphenylborate salt of N-methylmorpholine; tertiary amine compounds such as pyridine, triethylamine, triethylenediamine, benzyldimethylamine, triethanolamine, dimethylaminoethanol, and tris(dimethylaminomethyl)phenol; derivatives of the tertiary amine compounds; ammonium salt compounds such as tetra-n-butylammonium acetate, tetra-n-butylammonium phosphate, tetraethylammonium acetate, tetra-n-hexyl ammonium benzoate, and tetrapropylammonium hydroxide; organic phosphines such as primary phosphines including ethylphosphine and phenylphosphine, secondary phosphines such as dimethylphosphine and diphenylphosphine, and tertiary phosphines such as triphenylphosphine, diphenyl(p-tolyl)phosphine, tris(alkylphenyl)phosphine, tris(alkoxyphenyl)phosphine, tris(alkyl-alkoxyphenyl)phosphine, tris(dialkylphenyl)phosphine, tris(trialkylphenyl)phosphine, tris(tetraalkylphenyl)phosphine, tris(dialkoxyphenyl)phosphine, tris(trialkoxyphenyl)phosphine, tris(tetraalkoxyphenyl)phosphine, trialkylphosphine, dialkylarylphosphine, alkyldiarylphosphine, trinaphthylphosphine, and tris(benzyl)phosphine; phosphine compounds such as a complex of the organic phosphines and organic borons; compounds with intramolecular polarization obtained by adding a compound having a π bond, such as maleic anhydride, a quinone compound including 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, and phenyl-1,4-benzoquinone, or diazophenylmethane to the organic phosphines or the phosphine compounds; compounds with intramolecular polarization obtained by reacting the organic phosphines or the phosphine compounds with halogenated phenolic compounds such as 4-bromophenol, 3-bromophenol, 2-bromophenol, 4-chlorophenol, 3-chlorophenol, 2-chlorophenol, 4-iodophenol, 3-iodophenol, 2-iodophenol, 4-bromo-2-methylphenol, 4-bromo-3-methylphenol, 4-bromo-2,6-dimethylphenol, 4-bromo-3,5-dimethylphenol, 4-bromo-2,6-di-tert-butylphenol, 4-chloro-1-naphthol, 1-bromo-2-naphthol, 6-bromo-2-naphthol, and 4-bromo-4'-hydroxybiphenyl, and then performing a process of dehydrohalogenation; tetra-substituted phosphonium compounds such as tetra-substituted phosphonium including tetraphenylphosphonium, a tetraphenylborate salt of tetra-substituted phosphonium including tetraphenylphosphonium tetra-p-tolylborate, and salts of tetra-substituted phosphonium with a phenol compound; salts of tetraalkylphosphonium with partial hydrolysates of aromatic carboxylic acid anhydride; phosphobetaine compounds; and adducts of phosphonium compounds and silane compounds.

The curing promoters may be used alone or in a combination of two or more thereof.

Among these, the curing promoters are preferably curing promoters containing organic phosphines. Examples of curing promoters containing organic phosphines include: phosphine compounds such as organic phosphines and complexes of the organic phosphines and organic borons; and compounds having intramolecular polarization obtained by adding compounds having a π bond to the organic phosphines or the phosphine compounds.

Among these, examples of particularly suitable curing promoters include triphenylphosphine, adducts of triphenylphosphine and quinone compounds, adducts of tributylphosphine and quinone compounds, and adducts of tri-p-tolylphosphine.

In a case where the resin composition for molding contains a curing promoter, the amount of curing promoter is, based on 100 parts by mass of resin components, preferably 0.1 parts by mass to 30 parts by mass and more preferably 1 part by mass to 15 parts by mass. If the amount of curing promoter is 0.1 parts by mass or more with respect to 100 parts by mass of resin components, curing tends to favorably occur in a short period of time. If the amount of curing promoter is 30 parts by mass or less with respect to 100 parts by mass of resin components, the curing rate is not too fast and favorable molded products tend to be obtained.

Here, the resin components mean a curable resin and a curing agent which is used as necessary. In addition, 100 parts by mass of resin components means that the total amount of a curable resin and a curing agent which is used as necessary is 100 parts by mass.

(Curing Initiator)

In a case where the resin composition for molding contains a polyimide resin as a curable resin, the resin composition for molding may contain a curing initiator as necessary.

Examples of curing initiators include a radical polymerization initiator that generates free radicals by heat. Specific examples of curing initiators include an inorganic peroxide, an organic peroxide, and an azo compound.

Examples of inorganic peroxides include potassium persulfate (dipotassium peroxosulfate), sodium persulfate, and ammonium persulfate.

Examples of organic peroxide include: ketone peroxides such as methyl ethyl ketone peroxide and cyclohexanone peroxide; peroxy ketals such as 1,1-di(t-butylperoxy)cyclohexane, 2,2-di(4,4-di(t-butylperoxy)cyclohexyl)propane; hydroperoxides such as p-menthane hydroperoxide, diisopropylbenzene hydroperoxide, 1,1,3,3-tetramethylbutyl hydroperoxide, cumene hydroperoxide, and t-butyl hydroperoxide; dialkyl peroxides such as α,α'-di(t-butylperoxy)diisopropylbenzene, dicumyl peroxide, 2,5-dimethyl-2,5-di(t-butylperoxy)hexane, t-butyl cumyl peroxide, di-t-hexyl peroxide, 2,5-dimethyl-2,5-di(t-butylperoxy)hexyne-3, and di-t-butyl peroxide; diacyl peroxides such as dibenzoyl peroxide and di(4-methylbenzoyl) peroxide; peroxydicarbonates such as di-n-propyl peroxydicarbonate and diisopropyl peroxydicarbonate; and peroxy esters such as 2,5-dimethyl-2,5-di(benzoylperoxy)hexane, t-hexyl peroxybenzoate, t-butyl peroxybenzoate, and t-butylperoxy-2-ethyl hexanonate.

Examples of azo compounds include azobisisobutyronitrile, azobis-4-methoxy-2,4-dimethylvaleronitrile, azobiscyclohexanone-1-carbonitrile, and azodibenzoyl.

In a case where the resin composition for molding contains a curing initiator, the content of the curing initiator is, for example, 0.1 parts by mass to 8.0 parts by mass based on 100 parts by mass of a polyimide compound, and is more preferably 0.5 parts by mass to 6.0 parts by mass from the viewpoint of curability. If the content of the curing initiator is 8.0 parts by mass or less, volatile contents are less likely to be produced, and the occurrence of voids during curing tends to be further suppressed. In addition, by setting the content of the curing initiator to 1 part by mass or more, the curability tends to become more favorable.

(Inorganic Filler)

The resin composition for molding in the present embodiment includes an inorganic filler containing calcium titanate particles.

The inorganic filler contains at least calcium titanate particles, and may include fillers other than calcium titanate particles as necessary.

—Calcium Titanate Particles—

The shapes of calcium titanate particles are not particularly limited, and examples thereof include a spherical shape, an elliptical shape, and an amorphous shape. In addition, calcium titanate particles may be crushed.

Calcium titanate particles may be surface-treated.

The inorganic filler may contain spherical calcium titanate particles. In addition, the inorganic filler may contain both spherical calcium titanate particles and non-spherical calcium titanate particles (for example, amorphous calcium titanate particles).

By incorporating spherical calcium titanate particles into the inorganic filler, it is possible to achieve both a low dielectric loss tangent and a high dielectric constant in a cured product after molding while obtaining high fluidity. Specifically, when the inorganic filler contains spherical calcium titanate particles, high fluidity can be obtained even if the proportion of the inorganic filler in the resin composition for molding is increased. By increasing the proportion of the inorganic filler, the proportion of a curable resin whose dielectric loss tangent is relatively higher than that of the inorganic filler is reduced, making it possible to further reduce the dielectric loss tangent of a cured product after molding. For this reason, it is thought that it is possible to achieve both a high dielectric constant and a lower dielectric loss tangent while obtaining high fluidity.

Figure 2:
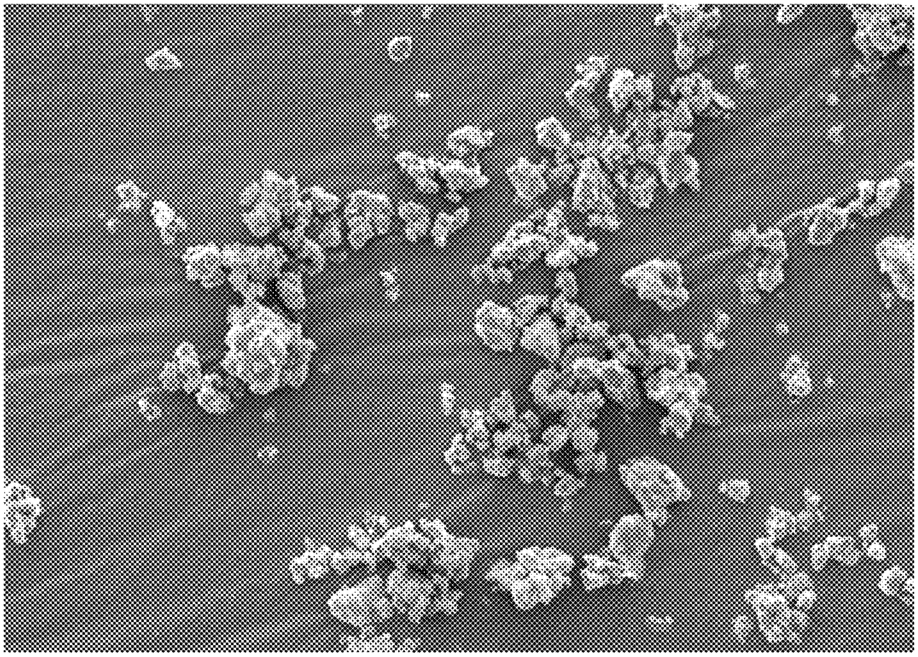
FIG. 2 is an SEM photograph of calcium titanate particles before performing spheroidizing treatment.

Here, spherical calcium titanate particles are particles subjected to spheroidizing treatment through heat-melting. FIG. 1 shows an SEM photograph of calcium titanate particles subjected to spheroidizing treatment. In addition, FIG. 2 shows an SEM photograph of calcium titanate particles before performing spheroidizing treatment. The SEM photographs of FIGS. 1 and 2 are photographs obtained by observation under high vacuum conditions at a magnification of 1000 times using a scanning electron microscope (manufactured by JEOL Ltd., product name of JSM-7800F).

The shapes of calcium titanate particles before spheroidizing treatment are usually irregular as shown in FIG. 2. By subjecting the amorphous calcium titanate particles to spheroidizing treatment, spherical calcium titanate particles are obtained as shown in FIG. 1.

The above-described spheroidizing treatment is performed through heat-melting at a temperature of 1000° C. to 1400° C. for 1 hour to 2 hours. The above-described spheroidizing treatment is different from calcining described below in that heating is performed without adding a dopant compound and the heating time is short. For this reason, by subjecting the amorphous calcium titanate particles to spheroidizing treatment without calcining, non-calcined spherical calcium titanate particles are obtained.

The volume average particle diameter of calcium titanate particles is preferably 0.1 μm to 100 μm, more preferably 0.2 μm to 80 μm, still more preferably 0.5 μm to 30 μm, particularly preferably 0.5 μm to 10 μm, and significantly preferably 0.5 μm to 8 μm.

The volume average particle diameter of calcium titanate particles can be measured as follows. A resin composition for molding is placed in a melting pot and allowed to stand at 800° C. for 4 hours to be incinerated. The obtained ash can observed with SEM and separated according to the shape, a particle size distribution can be obtained from the observation image, and a volume average particle diameter of calcium titanate particles can be obtained as a volume average particle diameter (D50) from the particle size distribution. In addition, the volume average particle diameter of calcium titanate particles may be obtained through measurement using a laser diffraction-scattering type particle size distribution measurement device (for example, LA920, Horiba, Ltd.).

Calcium titanate particles may be a mixture of two or more kinds of calcium titanate particles having different volume average particle diameters.

The content of calcium titanate particles is preferably 30% by volume to 80% by volume with respect to all inorganic fillers. In particular, from the viewpoint of obtaining a cured product with a high dielectric constant, the content of calcium titanate particles with respect to all inorganic fillers is preferably 30% by volume or more, more preferably 35% by volume or more, still more preferably 40% by volume or more, still more preferably 60% by volume or more, significantly preferably 63% by volume or more, and most preferably 65% by volume or more. On the other hand, the content of calcium titanate particles with respect to all inorganic fillers is, from the viewpoint of obtaining a cured product in which the occurrence of voids is suppressed, preferably 80% by volume or less, more preferably 77% by volume or less, still more preferably 75% by volume or less, and is, from the viewpoint of obtaining higher fluidity of the resin composition for molding, particularly preferably less than 60% by volume, significantly preferably 55% by volume or less, and most preferably 50% by volume or less.

The content of calcium titanate particles is, with respect to all inorganic fillers, preferably 30% by volume to 80% by volume, more preferably 35% by volume to 77% by volume, and still more preferably 40% by volume to 75% by volume. From the viewpoint of obtaining a cured product which has a high dielectric constant and a low dielectric loss tangent and in which the occurrence of voids is suppressed, the content of the calcium titanate particles is, with respect to all inorganic fillers, preferably 60% by volume to 80% by volume, more preferably 63% by volume to 77% by volume, and still more preferably 65% by volume to 75% by volume. From the viewpoints of achieving both a high dielectric constant and a low dielectric loss tangent of a cured product and obtaining high fluidity of the resin composition for molding, the content of the calcium titanate particles is, with respect to all inorganic fillers, preferably 30% by volume or more and less than 60% by volume, more preferably 35% by volume to 55% by volume, and still more preferably 40% by volume to 50% by volume.

In the case where the inorganic fillers contain spherical calcium titanate particles, it is possible to increase the content of the inorganic fillers in the entire resin composition for molding. Specifically, by incorporating spherical calcium titanate particles into the inorganic fillers, high fluidity can be obtained even if the total content of the inorganic fillers in the resin composition for molding is increased. For this reason, by increasing the content of other fillers with a relatively low dielectric loss tangent and reducing the content of a curable resin with a relatively high dielectric loss tangent without changing the content of calcium titanate particles in the entire resin composition for molding, it is possible to reduce the dielectric loss tangent while maintaining a high dielectric constant.

The content (% by volume) of calcium titanate particles in all inorganic fillers can be obtained through the following method.

A thin sample of a cured product of a resin composition for molding is imaged with a scanning electron microscope (SEM). An arbitrary area S is specified in the SEM image, and a total area A of inorganic fillers contained in the area S is obtained. Next, elements of the inorganic fillers are specified using an energy dispersive X-ray spectroscope (SEM-EDX) to obtain a total area B of calcium titanate particles contained in the total area A of the inorganic fillers. A value obtained by dividing the total area B of the calcium titanate particles by the total area A of the inorganic fillers is converted into a percentage (%), and this value is taken as a content (% by volume) of calcium titanate particles in all the inorganic fillers.

The area S is a sufficiently large area with respect to the size of the inorganic fillers. For example, the area S is sized to contain 100 or more inorganic fillers. The area S may be the sum of a plurality of cut surfaces.

The content of calcium titanate particles is preferably 15% by volume to 70% by volume with respect to the entire resin composition for molding. In particular, from the viewpoint of obtaining a cured product with a high dielectric constant, the content of calcium titanate particles with respect to the entire resin composition for molding is preferably 15% by volume or more, more preferably 25% by volume or more, still more preferably 27% by volume or more, still more preferably 40% by volume or more, significantly preferably 42% by volume or more, and most preferably 45% by volume or more. On the other hand, the content of calcium titanate particles with respect to the entire resin composition for molding is, from the viewpoint of obtaining a cured product in which the occurrence of voids is suppressed, preferably 70% by volume or less, more preferably 60% by volume or less, still more preferably 55% by volume or less, and is, from the viewpoint of obtaining higher fluidity of the resin composition for molding, particularly preferably less than 40% by volume, significantly preferably 35% by volume or less, and most preferably 33% by volume or less.

The content of calcium titanate particles with respect to the entire resin composition for molding is preferably 15% by volume to 70% by volume, more preferably 25% by volume to 60% by volume, and still more preferably 27% by volume to 55% by volume. From the viewpoint of obtaining a cured product which has a high dielectric constant and a low dielectric loss tangent and in which the occurrence of voids is suppressed, the content of the calcium titanate particles with respect to the entire resin composition for molding is preferably 40% by volume to 70% by volume, more preferably 42% by volume to 60% by volume, and still more preferably 45% by volume to 55% by volume. From the viewpoints of achieving both a high dielectric constant and a low dielectric loss tangent of a cured product and obtaining high fluidity of the resin composition for molding, the content of the calcium titanate particles with respect to the entire resin composition for molding is preferably 15% by volume or more and less than 40% by volume, more preferably 25% by volume to 35% by volume, and still more preferably 27% by volume to 33% by volume.

The mass proportion of the calcium titanate particles with respect to the total amount of an epoxy resin and a curing agent in the resin composition for molding (calcium titanate particles/total amount of epoxy resin and curing agent) is, from the viewpoint of a balance between a relative dielectric constant and fluidity, preferably 1 to 10, more preferably 1.5 to 8, still more preferably 2 to 6, and particularly preferably 2.5 to 5.

—Other Fillers—

The types of other fillers are not particularly limited. Specific examples of materials for other fillers include inorganic materials such as fused silica, crystal silica, glass, alumina, calcium carbonate, zirconium silicate, calcium silicate, silicon nitride, aluminum nitride, boron nitride, beryllia, zirconia, zircon, forsterite, steatite, spinel, mullite, titania, talc, clay, and mica.

Inorganic fillers having a flame-retardant effect may be used as the other fillers. Examples of inorganic fillers having a flame-retardant effect include aluminum hydroxide, magnesium hydroxide, a composite metal hydroxide such as a composite hydroxide of zinc and magnesium, and zinc borate.

The other fillers may be used alone or in a combination of two or more thereof.

Among these, the other fillers preferably contain at least one selected from the group consisting of silica particles and alumina particles from the viewpoint of reduction in dielectric loss tangent. The other fillers may contain only one of silica particles and alumina particles and contain both silica particles and alumina particles.

In a case where the other fillers contain at least one selected from the group consisting of silica particles and alumina particles, the total content of the silica particles and the alumina particles is, with respect to all the inorganic fillers, preferably 20% by volume to 70% by volume, more preferably 23% by volume to 65% by volume, and still more preferably 25% by volume to 60% by volume, and is, from the viewpoint of the balance between fluidity and a relative dielectric constant, particularly preferably 30% by volume to 60% by volume and significantly preferably 35% by volume to 50% by volume.

The other fillers preferably contain alumina particles from the viewpoint of increasing fluidity of a resin composition for molding.

In a case where the other fillers contain alumina particles, the content of the silica particles is, with respect to all the inorganic fillers, preferably 20% by volume to 70% by volume, more preferably 23% by volume to 65% by volume, and still more preferably 25% by volume to 60% by volume, and is, from the viewpoint of the balance between fluidity and a relative dielectric constant, particularly preferably 30% by volume to 60% by volume and significantly preferably 35% by volume to 50% by volume.

The other fillers may contain titanic acid compound particles other than calcium titanate particles. Examples of titanic acid compound particles other than calcium titanate particles include strontium titanate particles, barium titanate particles, potassium titanate particles, magnesium titanate particles, lead titanate particles, aluminum titanate particles, and lithium titanate particles.

However, from the viewpoint of reducing the dielectric loss tangent of a cured product to a low level, the content of barium titanate particles with respect to all the inorganic fillers is preferably less than 1% by volume, more preferably less than 0.5% by volume, and still more preferably less than 0.1% by volume. In other words, the inorganic fillers do not contain barium titanate particles or preferably contain barium titanate particles at the above-described content.

In addition, the total content of titanic acid compound particles other than calcium titanate particles may be, with respect to all the inorganic fillers, less than 1% by volume, less than 0.5% by volume, or less than 0.1% by volume. In other words, the inorganic fillers may not contain titanic acid compound particles other than calcium titanate particles or may contain titanic acid compound particles other than calcium titanate particles at the above-described content.

The volume average particle diameter of other fillers is not particularly limited. The volume average particle diameter of other fillers is preferably 0.2 μm to 100 μm and more preferably 0.5 μm to 50 μm. When the volume average particle diameter of other fillers is 0.2 μm or more, the increase in the viscosity of a resin composition for molding tends to be further suppressed. When the volume average particle diameter of other fillers is 100 μm or less, the filling properties of a resin composition for molding tend to be further improved.

With respect to the average particle diameter of other inorganic fillers, a resin composition for molding is placed in a melting pot and allowed to stand at 800° C. for 4 hours to be incinerated. The obtained ash can observed with SEM and separated according to the shape, a particle size distribution can be obtained from the observation image, and a volume average particle diameter of other fillers can be obtained as a volume average particle diameter (D50) from the particle size distribution. In addition, the volume average particle diameter of other fillers may be obtained through measurement using a laser diffraction-scattering type particle size distribution measurement device (for example, LA920, Horiba, Ltd.).

Other fillers may be a mixture of two or more kinds of fillers having different volume average particle diameters.

The volume average particle diameter of other fillers may be, from the viewpoint of the viscosity of the resin composition for molding, 3 μm or more or 5 μm or more, and may be, from the viewpoint of fluidity of the resin composition for molding, 10 μm or more or 20 μm or more.

From the viewpoints of fluidity and filling properties of the resin composition for molding, the ratio of the volume average particle diameter (μm) of other fillers to the volume average particle diameter (μm) of calcium titanate (volume average particle diameter of other fillers/volume average particle diameter of calcium titanate) is preferably greater than 1 and 20 or less, more preferably 1.5 to 15, and still more preferably 3 to 10.

The shapes of other fillers are not particularly limited, and examples thereof include a spherical shape, an elliptical shape, and an amorphous shape. In addition, other fillers may be crushed.

Other fillers preferably have a spherical shape from the viewpoint of improving fluidity of a resin composition for molding.

—Total Content and Characteristics of Inorganic Fillers—

The total content of inorganic fillers contained in a resin composition for molding with respect to the entire resin composition for molding is, from the viewpoint of suppressing strength and fluidity of a cured product of the resin composition for molding, preferably 40% by volume to 90% by volume, more preferably 40% by volume to 85% by volume, still more preferably 45% by volume to 85% by volume, particularly preferably 50% by volume to 82% by volume, and significantly preferably 55% by volume to 80% by volume.

In a case where the inorganic fillers contain spherical calcium titanate particles, high fluidity can be obtained even if the total content of the inorganic fillers contained in the resin composition for molding is increased. By increasing the total content of the inorganic fillers contained in the resin composition for molding, the content of a curable resin contained in the resin composition for molding is reduced, and a cured product with a low dielectric loss tangent is likely to be obtained.

From this point of view, in the case where the inorganic fillers contain spherical calcium titanate particles, the total content of the inorganic fillers contained in the resin composition for molding with respect to the entire resin composition for molding is preferably 70% by volume or more, more preferably greater than 73% by volume, still more preferably 75% by volume or more, and particularly preferably 77% by volume or more.

The content (% by volume) of inorganic fillers in a resin composition for molding can be obtained through the following method.

A thin sample of a cured product of a resin composition for molding is imaged with a scanning electron microscope (SEM). An arbitrary area S is specified in the SEM image, and a total area A of inorganic fillers contained in the area S is obtained. A value obtained by dividing the total area A of the inorganic fillers by the area S is converted into a percentage (%), and this value is taken as a content (% by volume) of the inorganic fillers in the resin composition for molding.

The area S is a sufficiently large area with respect to the size of the inorganic fillers. For example, the area S is sized to contain 100 or more inorganic fillers. The area S may be the sum of a plurality of cut surfaces.

The inorganic fillers may cause a bias in the abundance ratio in the gravity direction during curing of the resin composition for molding. In that case, when an image is taken with SEM, the entire gravity direction of the cured product is imaged, and the area S including the entire gravity direction of the cured product is specified.

The range of the relative dielectric constants of all inorganic fillers at 10 GHz is, for example, 80 or less. Hereinafter, the relative dielectric constant at 10 GHz is also simply referred to as a "dielectric constant."

In addition, in the inorganic fillers, the dielectric constants of all the inorganic fillers are or less, and the content of calcium titanate particles with respect to all the inorganic fillers is preferably 30% by volume or more.

Examples of methods of setting the content of calcium titanate particles to 30% by volume or more with respect to all the inorganic fillers and setting the dielectric constants of all the inorganic fillers to 80 or less include a method of using non-calcined calcium titanate particles as calcium titanate particles. Here, non-calcined calcium titanate particles are calcium titanate particles which have not undergone the following calcination step.

Here, the above-described "calcination step" is a step of adding a dopant compound containing other elements (that is, elements other than titanium and calcium) to calcium titanate particles and heating the mixture at a temperature of 1000° C. or higher for 3 hours or longer.

The dielectric constant of the calcium titanate particles is significantly increased through the above-described calcination step. For example, the dielectric constant after non-calcined calcium titanate particles are calcined at a temperature of 1000° C. for 3 hours is several times or more of the dielectric constant of calcium titanate before calcination.

For this reason, in a case where the dielectric constants of all the inorganic fillers are adjusted to 80 or lower while using calcined calcium titanate particles as calcium titanate particles, the content of the calcium titanate particles in all the inorganic fillers is reduced. Moreover, in a resin composition for molding in which inorganic fillers containing calcined calcium titanate particles at a low content and having a dielectric constant in all the inorganic fillers of 80 or lower is used, although a cured product having a high dielectric constant can be obtained, unevenness in the dielectric constant in the cured product is likely to occur. On the other hand, in a resin composition for molding in which an inorganic filler containing non-calcined calcium titanate particles at a content of 30% by volume or more and having a dielectric constant in the total of the inorganic filler of 80 or less is used, a cured product having a high dielectric constant and high uniformity in the dielectric constant can be obtained.

The dielectric constant of the entire inorganic filler is, from the viewpoint of suppressing dielectric loss, preferably 50 or less, more preferably 40 or less, and still more preferably 30 or less. The dielectric constant of the entire inorganic filler is, from the viewpoint of miniaturization of electronic components such as an antenna, preferably 5 or more, more preferably 10 or more, and still more preferably 15 or more. The dielectric constant of the entire inorganic filler is, from the viewpoints of suppression of dielectric loss and miniaturization of electronic components such as an antenna, preferably 5 to 50, more preferably 10 to 40, and still more preferably 15 to 30.

Here, the dielectric constant of the entire inorganic filler is obtained, for example, as follows.

Specifically, three or more kinds of resin compositions for measurement which contain inorganic fillers to be measured and a specific curable resin and have different contents of the inorganic fillers and a resin composition for measurement contains the specific curable resin but no inorganic filler are prepared. Examples of the resin compositions for measurement which contain inorganic fillers to be measured and a specific curable resin include resin compositions for measurement containing a biphenyl aralkyl-type epoxy resin, a phenol curing agent which is a phenol aralkyl-type phenol resin, a curing promoter containing organic phosphine, and inorganic fillers to be measured. In addition, examples of three or more resin compositions for measurement having different contents of inorganic fillers include resin compositions for measurement having contents of inorganic fillers of 10% by volume, 20% by volume, and 30% by volume with respect to the entire resin compositions for measurement.

Each of the resin compositions for measurement prepared are molded through compression molding under the conditions of a mold temperature of 175° C., a molding pressure of 6.9 MPa, and a curing time of 600 seconds to obtain respective cured products for measurement. The relative dielectric constant of each of the cured products for measurement obtained at 10 GHz is measured, and a graph is created in which the contents of inorganic fillers are plotted on the lateral axis and the measurement values of the relative dielectric constants are plotted on the longitudinal axis. From the obtained graph, linear approximation is performed through a least-squares method, and the relative dielectric constant when the contents of inorganic fillers are 100% by volume is obtained through extrapolation and used as "dielectric constants of all the inorganic fillers."

[Various Additives]

The resin composition for molding in the present embodiment may contain, in addition to the above-described components, various kinds of additives such as a coupling agent, an ion exchanger, a releasing agent, a flame retardant, a coloring agent, and a stress relaxation agent exemplified below. The resin composition for molding in the present embodiment may contain various kinds of additives well known in the technical field as necessary in addition to additives exemplified below.

(Coupling Agent)

The resin composition for molding in the present embodiment may contain a coupling agent. From the viewpoint of enhancing adhesiveness between resin components and inorganic fillers, the resin composition for molding preferably contains a coupling agent. Examples of coupling agents include well-known coupling agents such as silane compounds including epoxysilane, mercaptosilane, aminosilane, alkylsilane, ureidosilane, vinylsilane, and disilazane, titanium compounds, aluminum chelate compounds, and aluminum-zirconium compounds.

In a case where the resin composition for molding contains a coupling agent, the amount of coupling agent is, based on 100 parts by mass of inorganic fillers, preferably 0.05 parts by mass to 5 parts by mass and more preferably 0.1 parts by mass to 2.5 parts by mass. If the amount of coupling agent is 0.05 parts by mass or more with respect to 100 parts by mass of inorganic fillers, the adhesiveness with a frame tends to be further improved. If the amount of coupling agent is 5 parts by mass or less with respect to 100 parts by mass of inorganic fillers, the moldability of a package tends to be further improved.

(Ion Exchanger)

The resin composition for molding in the present embodiment may contain an ion exchanger. The resin composition for molding preferably contains an ion exchanger from the viewpoint of improving high-temperature shelf properties and moisture resistance of an electronic component device including electronic components to be sealed. The ion exchanger is not particularly limited, and well-known ones in the related art can be used. Examples thereof include hydrotalcite compounds and hydrous oxides of at least one selected from the group consisting of magnesium, aluminum, titanium, zirconium, and bismuth. The ion exchangers may be used alone or in a combination of two or more thereof. Among these, hydrotalcite represented by General Formula (A) below is preferable.

$$Mg_{(1-X)}AL_X(OH)_2(CO_3)_{X/2}\cdot mH_2O \quad (A)$$

($0<X\leq0.5$, m is a positive number)

In a case where the resin composition for molding contains an ion exchanger, the content thereof is not particularly limited as long as it is an amount sufficient to capture ions such as halogen ions. For example, the content of an ion exchanger is, based on 100 parts by mass of resin components, preferably 0.1 parts by mass to 30 parts by mass and more preferably 1 part by mass to 10 parts by mass.

(Releasing Agent)

The resin composition for molding in the present embodiment may contain a releasing agent from the viewpoint of obtaining favorable releasability from a mold during molding. The releasing agent is not particularly limited, and well-known ones in the related art can be used. Specific examples thereof include carnauba wax, higher fatty acids such as montanic acid and stearic acid, higher fatty acid metal salts, ester-based wax including montanic acid esters, and polyolefin-based wax including polyethylene oxides and non-oxidized polyethylene. The releasing agents may be used alone or in a combination of two or more thereof.

In a case where the resin composition for molding contains a releasing agent, the amount of releasing agent is, based on 100 parts by mass of resin components, preferably 0.01 parts by mass to 10 parts by mass and more preferably 0.1 parts by mass to 5 parts by mass. If the amount of releasing agent is 0.01 parts by mass or more with respect to 100 parts by mass of resin components, the sufficient releasability tends to be obtained. If the amount of releasing agent is 10 parts by mass or less, more favorable adhesiveness tends to be obtained.

(Flame Retardant)

The resin composition for molding in the present embodiment may contain a flame retardant. The flame retardant is not particularly limited, and well-known ones in the related art can be used. Specific examples thereof include organic or inorganic compounds containing halogen atoms, antimony atoms, nitrogen atoms, or phosphorus atoms, and metal hydroxides. The flame retardants may be used alone or in a combination of two or more thereof.

In a case where the resin composition for molding contains a flame retardant, the amount thereof is not particularly limited as long as it is an amount sufficient to obtain a desired flame-retardant effect. For example, the content of a flame retardant is, based on 100 parts by mass of resin components, preferably 1 part by mass to 30 parts by mass and more preferably 2 parts by mass to 20 parts by mass.

(Coloring Agent)

The resin composition for molding in the present embodiment may contain a coloring agent. Examples of coloring agents include well-known coloring agents such as carbon black, organic dyes, organic pigments, titanium oxide, red lead, and red oxide. The content of a coloring agent can be appropriately selected depending on the purpose and the like. The coloring agents may be used alone or in a combination of two or more thereof.

(Stress Relaxation Agent)

The resin composition for molding in the present embodiment may contain a stress relaxation agent. If the resin composition for molding contains a stress relaxation agent, warpage deformation of a package and generation of package cracks can be further reduced. Examples of stress relaxation agents include generally used well-known stress relaxation agents (flexible agents). Specific examples thereof include thermoplastic elastomers based on silicone, styrene, olefin, urethane, polyester, polyether, polyamides, polybutadiene, and the like; rubber particles such as natural rubber (NR), acrylonitrile-butadiene rubber (NBR), acrylic rubber, urethane rubber, and silicone powder; and rubber particles, such as a methyl methacrylate-styrene-butadiene copolymer (MBS), a methyl methacrylate-silicone copolymer, and a methyl methacrylate-butyl acrylate copolymer, having a core-shell structure. The stress relaxation agents may be used alone or in a combination of two or more thereof.

Among the stress relaxation agents, a silicone-based stress relaxation agent is preferable. Examples of silicone-based stress relaxation agents include one having an epoxy group, one having an amino group, and one obtained by modifying these with polyether, and a silicone compound having an epoxy group and a silicone compound such as a polyether-based silicone compound are more preferable.

In a case where the resin composition for molding contains a stress relaxation agent, the amount of stress relaxation agent based on 100 parts by mass of resin components is, for example, preferably 1 part by mass to 30 parts by mass and more preferably 2 parts by mass to parts by mass.

(Method for Preparing Resin Composition for Molding)

A method for preparing a resin composition for molding is not particularly limited. Examples of general methods include a method for sufficiently mixing predetermined formulation amounts of components with a mixer or the like, followed by melt-kneading the mixture with a mixing roll, an extruder, and the like, and cooling and pulverizing the mixture. More specific examples thereof include a method for stirring and mixing predetermined amounts of the above-described components, kneading the mixture with an extruder, a roll, a kneader, and the like preheated to 70° C. to 140° C., and cooling and pulverizing the mixture.

The resin composition for molding in the present embodiment is preferably a solid at normal temperature and pressure (for example, at 25° C. under atmospheric pressure). The shape of the resin composition for molding in a case where the resin composition for molding is a solid is not particularly limited, but examples thereof include a powdery shape, a granular shape, and a tablet shape. The resin composition for molding in a case where the resin composition for molding has a tablet shape preferably has dimensions and mass that suit molding conditions of a package from the viewpoint of handleability.

(Characteristics of Resin Composition for Molding)

The relative dielectric constant of a cured product, obtained by molding the resin composition for molding in the present embodiment through compression molding under the conditions of a mold temperature of 175° C., a molding pressure of 6.9 MPa, a curing time of 600 seconds, at 10 GHz is, for example, 9 to 40. The relative dielectric constant of the cured product at 10 GHz is preferably 10 to 35 and more preferably 13 to 30 from the viewpoint of miniaturization of electronic components such as an antenna.

The above-described relative dielectric constant is measured using a dielectric constant measurement device (for example, Agilent Technologies, product name "Network Analyzer N5227A") at a temperature of 25±3° C.

The dielectric loss tangent of a cured product, obtained by molding the resin composition for molding in the present embodiment through compression molding under the conditions of a mold temperature of 175° C., a molding pressure of 6.9 MPa, a curing time of 600 seconds, at 10 GHz is, for example, 0.020 or less. The dielectric loss tangent of the cured product at 10 GHz is preferably 0.018 or less, more preferably 0.015 or less, and still more preferably 0.010 or less from the viewpoint of reducing transmission loss. The lower limit value of the dielectric loss tangent of the cured product at 10 GHz is not particularly limited, and is, for example, 0.005.

The above-described dielectric loss tangent is measured using a dielectric constant measurement device (for example, Agilent Technologies, product name "Network Analyzer N5227A") at a temperature of 25±3° C.

The flow distance when a resin composition for molding is molded using a mold for measuring a spiral flow according to EMMI-1-66 under the conditions of a mold temperature of 175° C., a molding pressure of 6.9 MPa, and a curing time of 90 seconds is preferably 80 cm or more, more preferably 100 cm or more, and still more preferably 120 cm or more. Hereinafter, the above-described flow distance is also referred to as "spiral flow." The upper limit value of the spiral flow is not particularly limited, and is, for example, 200 cm.

The gel time of the resin composition for molding at 175° C. is preferably 30 seconds to 100 seconds and more preferably 40 seconds to 70 seconds.

The gel time at 175° C. is measured as follows. Specifically, the measurement of the gel time using Curelastometer of JSR Trading Co., Ltd. is performed on 3 g of a sample of the resin composition for molding at a temperature of 175° C., and the time until a torque curve rises is regarded as gel time (sec).

(Application of Resin Composition for Molding)

The resin composition for molding in the present embodiment can be applied to, for example, production of an electronic component device to be described below, particularly to production of a high frequency device. The resin composition for molding of the present embodiment may be used for sealing an electronic component in a high-frequency device.

In particular, in recent years, with the spread of the 5th generation mobile communication system (5G), semiconductor packages (PKGs) used in electronic component devices have become highly functionalized and compact. Thus, along with the high functionality and the miniaturization of semiconductor PKGs, development of antenna-in-packages (AiPs) which have an antenna function is also in progress. In AiPs, the frequency of radio waves used for communication is increased in order to cope with an increase in the number of channels due to diversification of information. For this reason, both a high dielectric constant and a low dielectric loss tangent are required for a sealing material.

As described above, the resin composition for molding in the present embodiment provides a cured product in which both a high dielectric constant and a low dielectric loss tangent are achieved. For this reason, the resin composition for molding is particularly suitable for an antenna-in-package (AiP) in a high frequency device in which an antenna placed on a support member is sealed with the resin composition for molding.

<Electronic Component Device>

An electronic component device which is an embodiment of the present disclosure includes: a support member; an electronic component placed on the support member; and a cured product of the resin composition for molding which seals the electronic component.

Examples of electronic component devices include ones (for example, a high frequency device) obtained by sealing an electronic component region obtained by mounting electronic components (such as active elements including semiconductor chips, transistors, diodes, thyristors, passive elements including capacitors, resistors, and coils, and antennas) on support members such as lead frames, wired tape carriers, wiring boards, glass, silicon wafers, organic substrates with a resin composition for molding.

The types of the above-described support members are not particularly limited, and generally used support members can be used for manufacturing an electronic component device.

The above-described electronic components may contain an antenna or may contain an antenna and elements in addition to the antenna. The above-described antenna is not limited as long as it plays a role of an antenna, and may be an antenna element or may be wiring.

In addition, in the electronic component device of the present embodiment, other electronic components may be arranged on the surface of the support member opposite to the surface on which the above-described electronic components are arranged as necessary. The other electronic components may be sealed with the resin composition for molding or with other resin compositions, or may not be sealed.

(Method for Manufacturing Electronic Component Device)

A method for manufacturing an electronic component device according to the present embodiment includes a step of arranging electronic components on a support member and a step of sealing the electronic components with the resin composition for molding.

The method for carrying out the above-described each step is not particularly limited, and can be carried out through a general method. In addition, the types of support members and electronic components used for manufacturing an electronic component device are not particularly limited, and support members and electronic components generally used for manufacturing an electronic component device can be used.

Examples of methods for sealing electronic components using the resin composition for molding include a low-pressure transfer molding method, an injection molding method, and a compression molding method. Among these, a low-pressure transfer molding method is common.

EXAMPLES

Hereinafter, the above-described embodiment will be described in detail using examples, but the scope of the above-described embodiment is not limited to these examples.

<Preparation of Resin Composition for Molding>

The components shown below are mixed at the formulation ratios (parts by mass) shown in Tables 1 to 3 to prepare resin compositions for molding of examples and comparative examples. These resin compositions for molding are solids at normal temperature and pressure.

In Tables 1 to 3, blanks mean that the component is not contained.

In addition, results obtained through the above-described methods for the content ("particle proportion (% by volume)" in the tables) of calcium titanate particles in all inorganic fillers used, the content ("content (% by volume)" in the tables) of the inorganic fillers in the entire resin composition for molding, and the relative dielectric constant ("dielectric constant of fillers" in the tables) of all the inorganic fillers at 10 GHz are also shown in Tables 1 to 3.

Epoxy resin 1: Triphenylmethane-type epoxy resin, epoxy equivalent of 167 g/eq (Mitsubishi Chemical Corporation, product name "1032H60")

Epoxy resin 2: Biphenyl aralkyl-type epoxy resin, epoxy equivalent of 274 g/eq (Nippon Kayaku Co., Ltd., product name "NC-3000")

Epoxy resin 3: Biphenyl-type epoxy resin, epoxy equivalent of 192 g/eq (Mitsubishi Chemical Corporation, Product name "YX-4000")

Curing agent 1: Active ester compound, DIC Corporation, product name "EXB-8"

Curing agent 2: Phenol curing agent, aralkyl-type phenol resin, hydroxyl equivalent of 170 g/eq (Meiwa Plastic Industries, Ltd., product name "MEH7800 series")

Inorganic filler 1: Silica particles, other fillers, volume average particle diameter of 11 μm, spherical shape Inorganic filler 2: Alumina particles, other fillers, volume average particle diameter of 45 μm, spherical shape Inorganic filler 3: Alumina particles, other fillers, volume average particle diameter of 7 μm, spherical shape Inorganic filler 4: Non-calcined calcium titanate particles, volume average particle diameter of 6 μm, amorphous shape Inorganic filler 5: Non-calcined calcium titanate particles, volume average particle diameter of 0.2 μm, amorphous shape Inorganic filler 6: Non-calcined barium titanate particles, volume average particle diameter of 6.6 μm, spherical shape Inorganic filler 7: Non-calcined calcium titanate particles, volume average particle diameter of 9 μm, spherical shape Curing promoter: Triphenylphosphine/1,4-benzoquinone adduct Coupling agent: N-phenyl-3-aminopropyltrimethoxysilane (Shin-Etsu Chemical Co., Ltd., product name "KBM-573")

Releasing agent: Montanic acid ester wax (Clariant Japan K.K., product name "HW-E")

Coloring agent: Carbon black (Mitsubishi Chemical Corporation, product name "MA600")

Silicone 1: Polyether-based silicone compound (Momentive Performance Materials, product name "SIM768E")

Silicone 2: Silicone compound having epoxy group (Dow Toray Co., Ltd., product name "AY42-119")

The volume average particle diameter of the above-described inorganic fillers is a value obtained through the following measurement.

Specifically, an inorganic filler is first added to a dispersion medium (water) in a range of 0.01 mass % to 0.1 mass %, and the mixture is dispersed in a bath-type ultrasonic cleaner for 5 minutes.

5 mL of the obtained dispersion was injected into a cell, and the particle size distribution was measured at 25° C. using a laser diffraction-scattering type particle size distribution measurement device (Horiba, Ltd., LA920).

The particle diameter at an integrated value of 50% in the obtained particle size distribution was set to a volume average particle diameter.

<Evaluation of Resin Composition for Molding>

(Relative Dielectric Constant and Dielectric Loss Tangent)

Each resin composition for molding was added to a vacuum hand press machine, molded under the conditions of a mold temperature of 175° C., a molding pressure of 6.9 MPa, and a curing time of 600 seconds, and post-cured at 175° C. for 6 hours to obtain a plate-like cured product (a length of 12.5 mm, a width of 25 mm, and a thickness of 0.2 mm). This plate-like cured product was used as a test piece to measure a relative dielectric constant and a dielectric loss tangent at a temperature of 25±3° C. and 10 GHz using a dielectric constant measurement device (Agilent Technologies, product name "Network Analyzer N5227A"). The results are shown in Tables 1 to 3 (the "relative dielectric constant" and the "dielectric loss tangent" in the tables).

(Fluidity: Spiral Flow)

Each resin composition for molding was molded using a mold for measuring a spiral flow according to EMMI-1-66 under the conditions of a mold temperature of 180° C., a molding pressure of 6.9 MPa, and a curing time of 120 seconds to obtain a flow distance (cm). The results are shown in Tables 1 to 3 ("flow distance (cm)" in the tables).

(Gel Time)

The measurement of the gel time using Curelastometer of JSR Trading Co., Ltd. was performed on 3 g of each resin composition for molding at a temperature of 175° C., and the time until a torque curve rose was regarded as gel time. The results are shown in Tables 1 to 3 ("gel time (seconds)" in the tables).

In the tables, "poor" means that the gel time is so short that the rise of the torque curve cannot be observed.

TABLE 1

| | | Example 1 | Example 2 | Example 3 | Example 4 | Example 5 | Example 6 |
|---|---|---|---|---|---|---|---|
| Composition | Epoxy resin 1 | 75 | 75 | 75 | 75 | 75 | 70 |
| | Epoxy resin 2 | | | | | | |
| | Epoxy resin 3 | 25 | 25 | 25 | 25 | 25 | 30 |
| | Curing agent 1 | 120 | 120 | 120 | 120 | 120 | 119 |
| | Curing agent 2 | | | | | | |
| | Inorganic filler 1 | | | | | | |
| | Inorganic filler 2 | 362 | 604 | 846 | 500 | 150 | |
| | Inorganic filler 3 | | | | | | 538 |
| | Inorganic filler 4 | 759 | 633 | 380 | 595 | 1253 | 564 |
| | Inorganic filler 5 | 127 | | | 127 | 157 | 126 |
| | Inorganic filler 6 | | | | | | |
| | Curing promoter | 3.3 | 3.3 | 3.3 | 3.3 | 3.3 | 5 |
| | Coupling agent | 8 | 8 | 8 | 8 | 8 | 8 |
| | Releasing agent | 1 | 1 | 1 | 1 | 1 | 1 |
| | Coloring agent | 2.8 | 2.8 | 2.8 | 2.8 | 2.8 | |
| | Silicone 1 | 5 | 5 | 5 | 5 | 5 | 5 |
| | Silicone 2 | | | | | | |
| | Total | 1488 | 1477 | 1466 | 1462 | 1800 | 1466 |
| Fillers | Particle proportion (% by volume) | 70 | 50 | 30 | 60 | 90 | 55 |
| | Content (% by volume) | 60 | 60 | 60 | 60 | 65 | 60 |
| | Dielectric constant of fillers | 30.4 | 23.9 | 17.5 | 27.1 | 36.8 | 25.5 |
| Evaluation | Relative dielectric constant | 21.2 | 14.7 | 9.4 | 18.9 | 24.9 | 17.0 |
| | Dielectric loss tangent | 0.0074 | 0.0073 | 0.0072 | 0.0080 | 0.0080 | 0.0082 |
| | Flow distance (cm) | 150 | 160 | 180 | 150 | 80 | 134 |
| | Gel time (seconds) | 60 | 60 | 60 | 68 | 60 | 50 |

TABLE 2

| | | Example 7 | Example 8 | Example 9 | Example 10 | Example 11 |
|---|---|---|---|---|---|---|
| Composition | Epoxy resin 1 | | 70 | | 70 | 70 |
| | Epoxy resin 2 | 75 | | 75 | | |
| | Epoxy resin 3 | 25 | 30 | 25 | 30 | 30 |
| | Curing agent 1 | | 119 | | 119 | 119 |
| | Curing agent 2 | 70.6 | | 70.6 | | |

TABLE 2-continued

| | | Example 7 | Example 8 | Example 9 | Example 10 | Example 11 |
|---|---|---|---|---|---|---|
| | Inorganic filler 1 | | 312 | 273 | | |
| | Inorganic filler 2 | | | | | |
| | Inorganic filler 3 | 473 | | | 754 | 1006 |
| | Inorganic filler 4 | 496 | 564 | 494 | 552 | 636 |
| | Inorganic filler 5 | 111 | 126 | 110 | 258 | 300 |
| | Inorganic filler 6 | | | | | |
| | Curing promoter | 3.5 | 5 | 2.5 | 4.7 | 4.7 |
| | Coupling agent | 8 | 8 | 8 | 8 | 8 |
| | Releasing agent | 1 | 1 | 1 | 1 | 1 |
| | Coloring agent | | | | | |
| | Silicone 1 | 5 | 5 | 5 | 10 | 10 |
| | Silicone 2 | 20 | | 20 | | |
| | Total | 1268 | 1240 | 1064 | 1787 | 2185 |
| Fillers | Particle proportion (% by volume) | 55 | 55 | 55 | 50 | 47 |
| | Content (% by volume) | 60 | 60 | 60 | 65 | 70 |
| | Dielectric constant of fillers | 25.5 | 23.6 | 23.6 | 23.9 | 22.9 |
| Evaluation | Relative dielectric constant | 17.5 | 15.1 | 14.7 | 16.9 | 18.2 |
| | Dielectric loss tangent | 0.0130 | 0.0070 | 0.0140 | 0.0082 | 0.0080 |
| | Flow distance (cm) | 160 | 144 | 102 | 110 | 83 |
| | Gel time (seconds) | 73 | 70 | 82 | 45.3 | 40.5 |

TABLE 3

| | | Example 12 | Example 13 | Example 14 | Comparative Example 1 | Comparative Example 2 | Comparative Example 3 |
|---|---|---|---|---|---|---|---|
| Composition | Epoxy resin 1 | 75 | 75 | 75 | 70 | 70 | 70 |
| | Epoxy resin 2 | | | | | | |
| | Epoxy resin 3 | 25 | 25 | 25 | 30 | 30 | 30 |
| | Curing agent 1 | 120 | 120 | 120 | 119 | 119 | 119 |
| | Curing agent 2 | | | | | | |
| | Inorganic filler 1 | 210 | 350 | 490 | | | |
| | Inorganic filler 2 | | | | 365 | 609 | 852 |
| | Inorganic filler 3 | | | | | | |
| | Inorganic filler 4 | 886 | 633 | 380 | | | |
| | Inorganic filler 5 | | | | | | |
| | Inorganic filler 6 | | | | 1345 | 961 | 577 |
| | Curing promoter | 3.3 | 3.3 | 3.3 | 3.3 | 3.3 | 3.3 |
| | Coupling agent | 8 | 8 | 8 | 8 | 8 | 8 |
| | Releasing agent | 1 | 1 | 1 | 1 | 1 | 1 |
| | Coloring agent | | | | | | |
| | Silicone 1 | 5 | 5 | 5 | 5 | 5 | 5 |
| | Silicone 2 | | | | | | |
| | Total | 1333 | 1220 | 1107 | 1946 | 1806 | 1665 |
| Fillers | Particle proportion (% by volume) | 70 | 50 | 30 | 0 | 0 | 0 |
| | Content (% by volume) | 60 | 60 | 60 | 60 | 60 | 60 |
| | Dielectric constant of fillers | 29.0 | 21.8 | 14.5 | 34.7 | 27.0 | 19.3 |
| Evaluation | Relative dielectric constant | 18.5 | 14.1 | 9.8 | 20.62 | 13.16 | 6.79 |
| | Dielectric loss tangent | 0.0073 | 0.0066 | 0.0061 | 0.0408 | 0.0335 | 0.0132 |
| | Flow distance (cm) | 100 | 120 | 130 | 134 | 130 | 145 |
| | Gel time (seconds) | 60 | 60 | 60 | 52 | 64 | 60 |

As shown in Tables 1 to 3, the resin compositions for molding of the examples have both a high relative dielectric constant and a low dielectric loss tangent in a cured product after molding compared to the resin compositions for molding of the comparative examples.

Examples 15 and 16

The components were mixed with each other at the formulation ratios (parts by mass) shown in Table 4 to prepare resin compositions for molding of Examples 15 and 16. These resin compositions for molding were solids at normal temperature and pressure. In Example 15, a curing agent 1 and a curing agent 3 are used in combination, and no silicone is used in Examples 15 and 16.

In Table 4, blanks mean that the component is not contained. In addition, each item in Table 4 is the same as each item in Tables 1 to 3.

The curing agent 3 used in Example 15 is as follows.

Curing agent 3: Phenol curing agent, aralkyl-type phenol resin, hydroxyl equivalent of 202 g/eq (Meiwa Plastic Industries, Ltd., product name "MEH7851SS")

TABLE 4

| | | Example 15 | Example 16 |
|---|---|---|---|
| Composition | Epoxy resin 1 | | 75 |
| | Epoxy resin 2 | 70 | |
| | Epoxy resin 3 | 30 | 25 |
| | Curing agent 1 | 51.6 | 120 |
| | Curing agent 2 | | |
| | Curing agent 3 | 32.8 | |
| | Inorganic filler 1 | | |
| | Inorganic filler 2 | | 582 |
| | Inorganic filler 3 | 496 | |
| | Inorganic filler 4 | 415 | 610 |
| | Inorganic filler 5 | 104 | |
| | Inorganic filler 6 | | |
| | Curing promoter | 3.3 | 3.3 |
| | Coupling agent | 8 | 8 |
| | Releasing agent | 1 | 1 |
| | Coloring agent | 2.8 | 2.8 |
| | Total | 1215 | 1427.1 |
| Fillers | Particle proportion (% by volume) | 50 | 50 |
| | Content (% by volume) | 60 | 60 |
| | Dielectric constant of fillers | 21.9 | 23.9 |
| Evaluation | Relative dielectric constant | 14.1 | 14.8 |
| | Dielectric loss tangent | 0.0080 | 0.0078 |
| | Flow distance (cm) | 150 | 150 |
| | Gel time (seconds) | 60 | 60 |

As shown in Table 4, the resin compositions for molding of Examples 15 and 16 have both a high relative dielectric constant and a low dielectric loss tangent in a cured product after molding compared to the resin compositions for molding of the comparative examples shown in Table 3.

<Evaluation of Resin Composition for Molding>

(Bending Strength)

The resin compositions for molding obtained in the examples and comparative examples were used to obtain cured products of the resin compositions for molding under the conditions as those for (the relative dielectric constant and the dielectric loss tangent).

The cured products were cut out into rectangular parallelepipeds of 4.0 mm×10.0 mm×80 mm to prepare test pieces for evaluating bending strength. These test pieces were used to perform a bending test using a Tensilon universal material tester (Instron 5948, Instron) under the conditions of an inter-fulcrum distance of 64 mm, a cross-head speed of 10 mm/min, and a temperature of 25° C. Using the measurement results, a bending stress-displacement curve was created from Equation (A), and the maximum stress was taken as bending strength.

$$\sigma=3FL/2bh^2 \quad \text{Equation (A)}$$

σ: Bending stress (MPa)

F: Bending load (N)

L: Inter-fulcrum distance (mm)

b: Test piece width (mm)

h: Test piece thickness (mm)

(Bending Toughness)

The bending toughness was evaluated by measuring fracture toughness values (MPa·$m^{1/2}$) of the cured products. The cured products were cut out into rectangular parallelepipeds of 4.0 mm×10.0 mm×80 mm to prepare test pieces for evaluating bending toughness. The size of crack defects of the test pieces for evaluating bending toughness was set to 4.0 mm×2.0 mm×1.0 mm. The fracture toughness values were calculated through three-point bending measurement using the test pieces for evaluating bending toughness and a Tensilon universal material tester (Instron 5948, Instron) based on ASTM D5045.

Measurement results of the bending strength and the fracture toughness values in the examples and comparative examples are shown in Table 5.

TABLE 5

| | Bending strength (MPa) | Fracture toughness value (MPa · $m^{1/2}$) |
|---|---|---|
| Example 1 | 90 | 2.6 |
| Example 2 | 90 | 2.6 |
| Example 3 | 95 | 2.6 |
| Example 4 | 92 | 2.6 |
| Example 5 | 90 | 2.6 |
| Example 6 | 90 | 2.6 |
| Example 7 | 130 | 2.9 |
| Example 8 | 95 | 2.6 |
| Example 9 | 130 | 2.9 |
| Example 10 | 90 | 2.6 |
| Example 11 | 90 | 2.6 |
| Example 12 | 95 | 2.6 |
| Example 13 | 95 | 2.6 |
| Example 14 | 95 | 2.6 |
| Example 15 | 115 | 3.2 |
| Example 16 | 93 | 2.6 |
| Comparative Example 1 | 90 | 2.6 |
| Comparative Example 2 | 90 | 2.6 |
| Comparative Example 3 | 90 | 2.6 |

As shown in Table 5, the resin compositions for molding of Examples 7, 9, and 15 were evaluated to have favorable bending toughness after curing compared to the resin compositions for molding of the examples and comparative examples.

In Table 5, in a case where only an active ester compound was used as a curing agent, the evaluation of the bending toughness tended to be worse than a case where only a phenol curing agent was used as a curing agent. On the other hand, in the resin composition for molding of Example 15, by using both an active ester compound and a phenol curing agent in combination as curing agents, the evaluation of the bending toughness after curing was favorable compared to the case where only a phenol curing agent was used. Accordingly, in Example 15, it was confirmed that combined use of an active ester compound and a phenol curing agent as curing agents synergistically improved the bending toughness after curing. The improvement in bending toughness tends to suppress, for example, occurrence of cracks in a cured product.

Examples 17 to 19

The components were mixed with each other at the formulation ratios (parts by mass) shown in Table 6 to prepare resin compositions for molding of Examples 17 and 19. These resin compositions for molding were solids at normal temperature and pressure.

In Table 6, blanks mean that the component is not contained. In addition, each item in Table 6 is the same as each item in Tables 1 to 4.

The inorganic filler 7 used in Examples 17 to 19 is as follows.

Inorganic filler 7: Non-calcined calcium titanate particles, volume average particle diameter of 8.9 μm, spherical shape, inorganic filler obtained by subjecting amorphous calcium titanate particles to spheroidizing treatment at 1200° C. for 2 hours

TABLE 6

| | | Example 17 | Example 18 | Example 19 |
|---|---|---|---|---|
| Composition | Epoxy resin 1 | | 75 | 75 |
| | Epoxy resin 2 | 70 | | |
| | Epoxy resin 3 | 30 | 25 | 25 |
| | Curing agent 1 | 51.6 | 120 | 120 |
| | Curing agent 2 | | | |
| | Curing agent 3 | 32.8 | | |
| | Inorganic filler 1 | | | |
| | Inorganic filler 2 | | 362 | 604 |
| | Inorganic filler 3 | 1162 | | |
| | Inorganic filler 4 | | | |
| | Inorganic filler 5 | 188 | 127 | |
| | Inorganic filler 6 | | | |
| | Inorganic filler 7 | 468 | 759 | 633 |
| | Curing promoter | 3.3 | 3.3 | 3.3 |
| | Coupling agent | 8 | 8 | 8 |
| | Releasing agent | 1 | 1 | 1 |
| | Coloring agent | 2.8 | 2.8 | 2.8 |
| | Silicone 1 | | 5 | 5 |
| | Silicone 2 | | | |
| | Total | 2018 | 1488 | 1477 |
| Fillers | Particle proportion (% by volume) | 35 | 70 | 50 |
| | Content (% by volume) | 73 | 60 | 60 |
| | Dielectric constant of fillers | 19.1 | 30.4 | 23.9 |
| Evaluation | Relative dielectric constant | 15.0 | 21.2 | 14.7 |
| | Dielectric loss tangent | 0.0070 | 0.0074 | 0.0073 |
| | Flow distance (cm) | 70 | 155 | 164 |
| | Gel time (seconds) | 70 | 60 | 60 |

As shown in Table 6, the resin compositions for molding of Examples 17 to 19 have both a high relative dielectric constant and a low dielectric loss tangent in a cured product after molding compared to the resin compositions for molding of the comparative examples shown in Table 3. In addition, the resin compositions for molding of Examples 18 and 19 have the same content of inorganic fillers in the entire resin composition for molding, have a longer flow distance than those of the resin compositions for molding of Examples 1 and 2 which do not contain spherical calcium titanate particles, and have both a high dielectric constant and a low dielectric loss tangent likewise Examples 1 and 2.

The disclosures of PCT/JP2020/046412 filed on Dec. 11, 2020 and PCT/JP2021/017047 filed on Apr. 28, 2021 are incorporated in the present specification as a whole by reference.

All of the references, the patent application, and the technical standard described in the present specification are incorporated in the present specification to the same extent as in a case where incorporation of individual documents, patent application, and technical standard by reference is specifically and individually written.

The invention claimed is:

1. A resin composition for molding comprising:

a curable resin;

an inorganic filler containing calcium titanate particles; and a curing agent including a phenol curing agent and an active ester compound.

2. The resin composition for molding according to claim 1, wherein the curable resin includes an epoxy resin.

3. The resin composition for molding according to claim 2, wherein the phenol curing agent includes an aralkyl-type phenol resin.

4. The resin composition for molding according to claim 1, wherein the inorganic filler further includes another inorganic filler which is at least one selected from the group consisting of silica particles and alumina particles.

5. The resin composition for molding according to claim 4, wherein the other inorganic filler has a volume average particle diameter of 3 μm or more.

6. The resin composition for molding according to claim 1, wherein a content of the calcium titanate particles is 30% by volume to 80% by volume with respect to all the inorganic fillers.

7. The resin composition for molding according to claim 1, wherein relative dielectric constants of all the inorganic fillers at 10 GHz is 80 or less.

8. The resin composition for molding according to claim 1, wherein a total content of the inorganic fillers is 40% by volume to 85% by volume with respect to the entire resin composition for molding.

9. The resin composition for molding according to claim 1, wherein the calcium titanate particles have a volume average particle diameter of 0.2 μm to 80 μm.

10. The resin composition for molding according to claim 1, further comprising:

a curing promoter containing organic phosphine.

11. The resin composition for molding according to claim 1, wherein the inorganic fillers contain spherical calcium titanate particles.

12. The resin composition for molding according to claim 11, wherein a total content of the inorganic fillers is 70% by volume to 85% by volume with respect to the entire resin composition for molding.

13. The resin composition for molding according to claim 1, wherein a cured product of the resin composition for molding has a relative dielectric constant of 9 to 40 and a dielectric loss tangent of 0.020 or less.

14. The resin composition for molding according to claim 1, which is used in a high frequency device.

15. The resin composition for molding according to claim 14, which is used for sealing an electronic component in a high-frequency device.

16. The resin composition for molding according to claim 1, which is used in an antenna-in-package.

17. An electronic component device comprising:

a support member;

an electronic component placed on the support member; and a cured product of the resin composition for molding according to claim 1 which seals the electronic component.

18. The electronic component device according to claim 17, wherein the electronic component includes an antenna.

* * * * *